US009929018B2

(12) United States Patent
Bieck et al.

(10) Patent No.: US 9,929,018 B2
(45) Date of Patent: Mar. 27, 2018

(54) SEMICONDUCTOR WAFER AND METHOD FOR PRODUCING SAME

(71) Applicant: DISCO CORPORATION, Tokyo (JP)

(72) Inventors: Florian Bieck, Singapore (SG); Carolinda Sukmadevi Asfhandy, Singapore (SG); Sven-Manfred Spiller, Hannover (DE)

(73) Assignee: DISCO CORPORATION, Tokyo (JP)

( * ) Notice: Subject to any disclaimer, the term of this patent is extended or adjusted under 35 U.S.C. 154(b) by 48 days.

(21) Appl. No.: 14/634,733

(22) Filed: Feb. 28, 2015

(65) Prior Publication Data

US 2015/0235900 A1    Aug. 20, 2015

Related U.S. Application Data

(62) Division of application No. 12/994,211, filed as application No. PCT/IB2009/052163 on May 23, 2009, now abandoned.

(30) Foreign Application Priority Data

| May 23, 2008 | (EP) | ................................. 08104079 |
| Jan. 17, 2009 | (WO) | .................. PCT/IB2009/050166 |
| Jan. 22, 2009 | (WO) | .................. PCT/IB2009/050231 |

(51) Int. Cl.
*H01L 21/306* (2006.01)
*H01L 21/304* (2006.01)
*H01L 21/78* (2006.01)

(52) U.S. Cl.
CPC ...... *H01L 21/30604* (2013.01); *H01L 21/304* (2013.01); *H01L 21/3043* (2013.01); *H01L 21/78* (2013.01)

(58) Field of Classification Search
CPC . H01L 21/30604; H01L 21/304; H01L 21/78; H01L 21/3043
USPC ........................................... 451/177; 438/669
See application file for complete search history.

(56) References Cited

U.S. PATENT DOCUMENTS

| 6,276,995 B1 * | 8/2001 | Matsuta ................ H01F 27/292 125/12 |
| 2003/0097905 A1 * | 5/2003 | Yamada .................... B24B 7/17 75/246 |
| 2005/0277283 A1 * | 12/2005 | Lin ................... H01L 23/53238 438/618 |
| 2006/0252230 A1 * | 11/2006 | Yang ................... H01L 23/3114 438/455 |

(Continued)

FOREIGN PATENT DOCUMENTS

| DE | 102006015781 | 10/2007 |
| EP | 1061584 | 12/2000 |

*Primary Examiner* — Bo Fan
(74) *Attorney, Agent, or Firm* — George Liu

(57) ABSTRACT

A semiconductor wafer (12) with a thinned central portion (2) has a first side (3) and a second side (4) and at least one reinforcement structure for increasing the radial bending resistance of the semiconductor wafer (12). The reinforcement structure provides at least one passage (10) for a fluid flow between an inner face (9) of said one reinforcement structure towards an outer face (8) of the reinforcement structure. The passages (10) are manufactured in a z-direction coming from above the semiconductor wafer (12) in a direction which is essentially perpendicular to the surface, e.g. to the first side (3), of the semiconductor wafer (12).

7 Claims, 21 Drawing Sheets

(56) References Cited

U.S. PATENT DOCUMENTS

| | | | |
|---|---|---|---|
| 2007/0023136 A1* | 2/2007 | Priewasser | H01L 21/67092 156/272.8 |
| 2008/0045015 A1* | 2/2008 | Sekiya | B24B 1/00 438/691 |
| 2008/0076334 A1* | 3/2008 | Yoshida | B24B 1/00 451/177 |
| 2008/0102606 A1* | 5/2008 | Sekiya | B23K 26/04 438/463 |

* cited by examiner

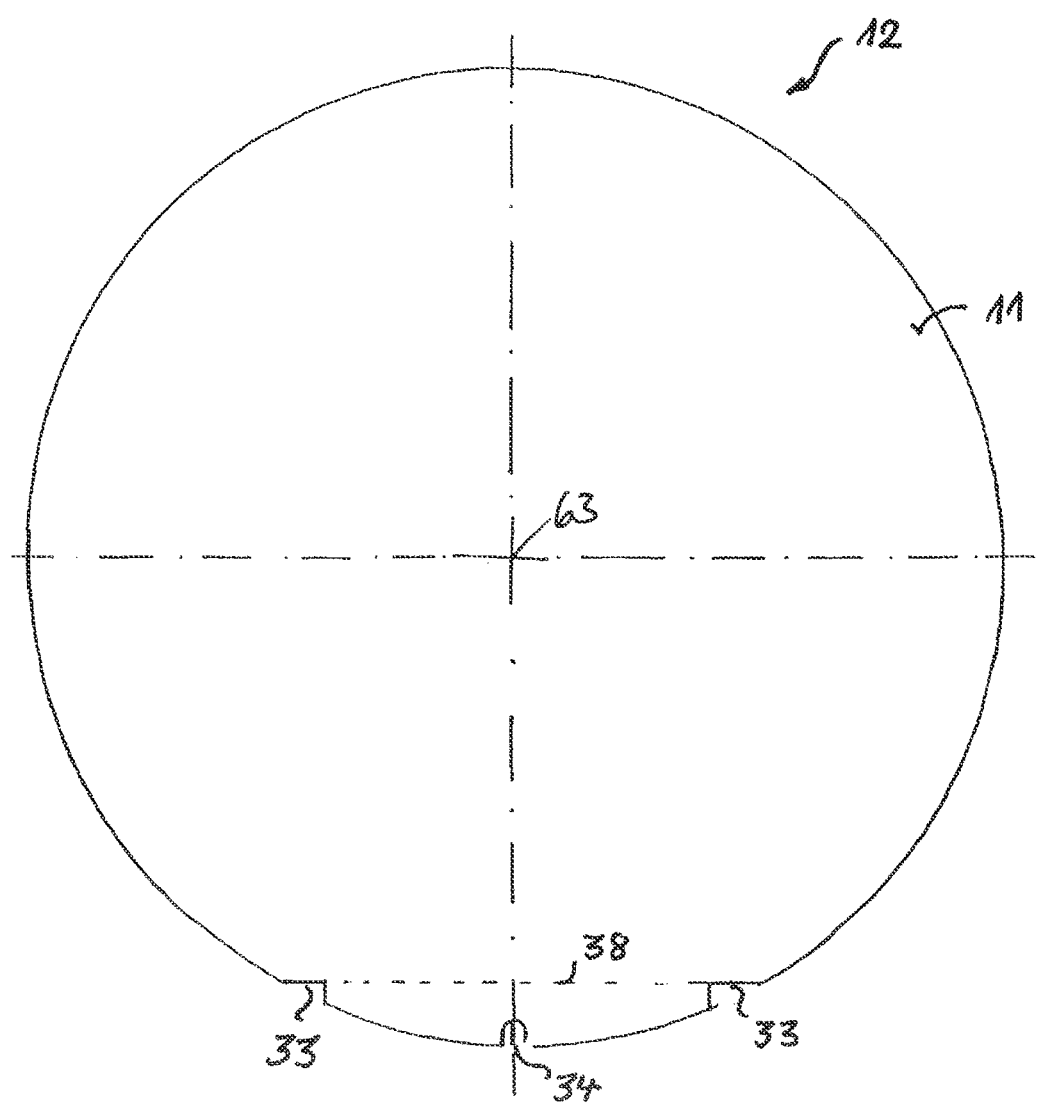

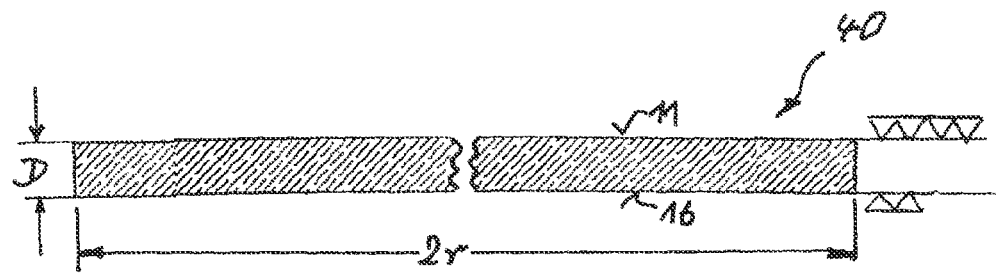
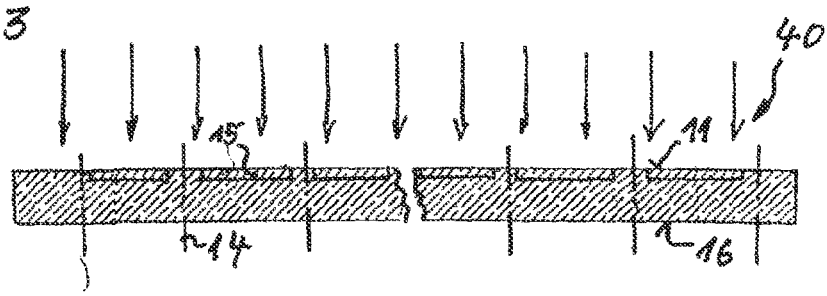
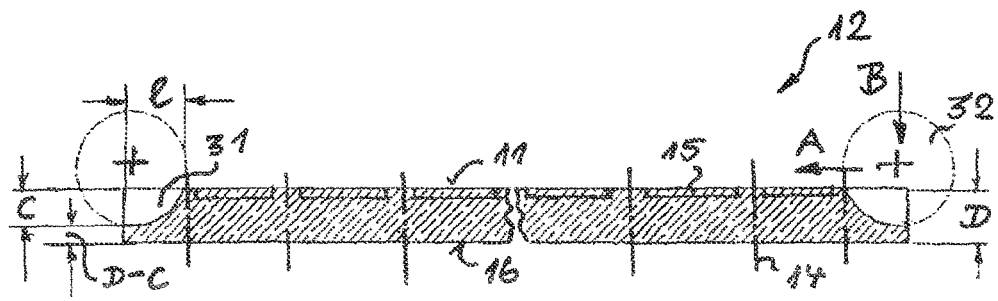

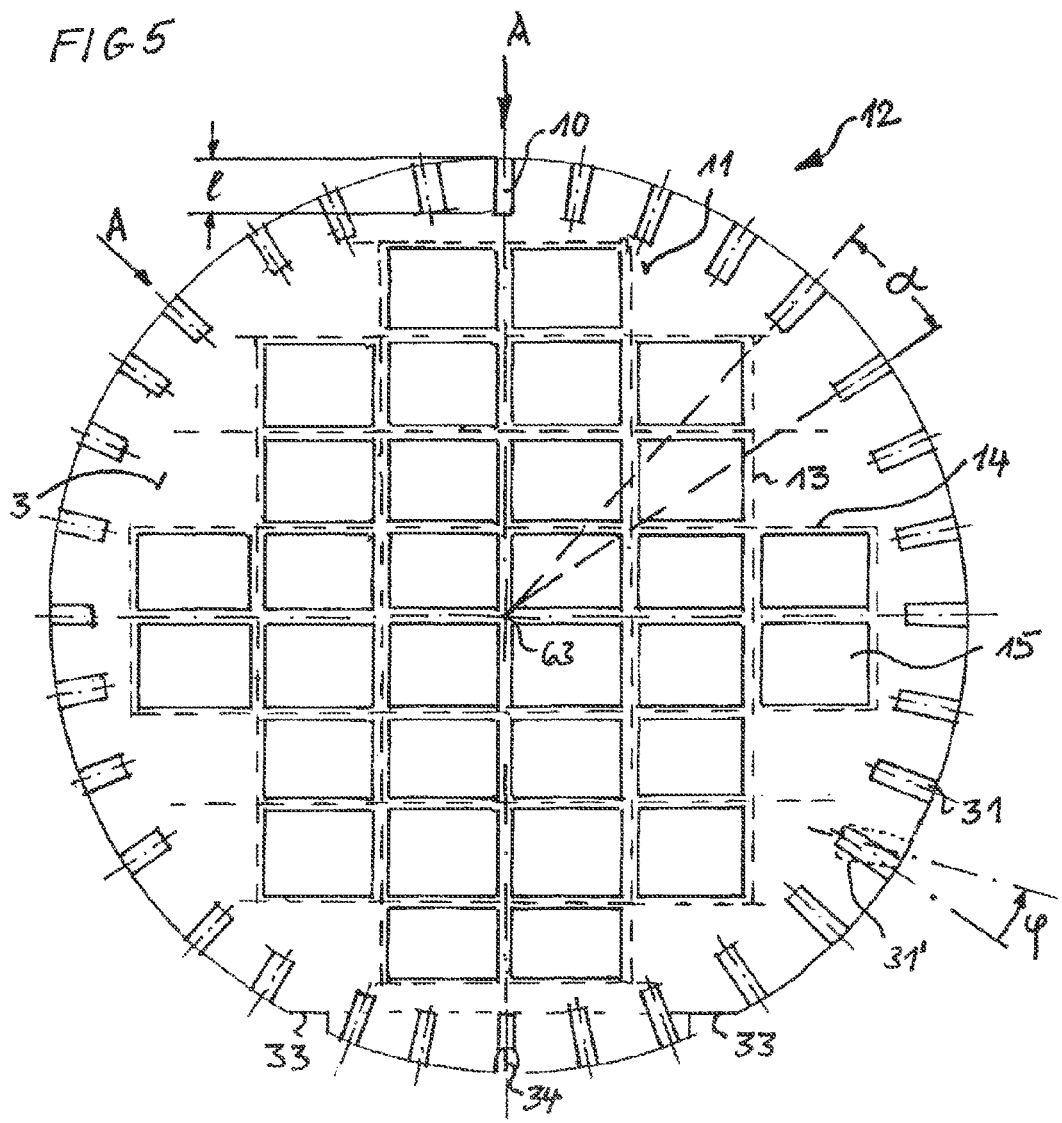
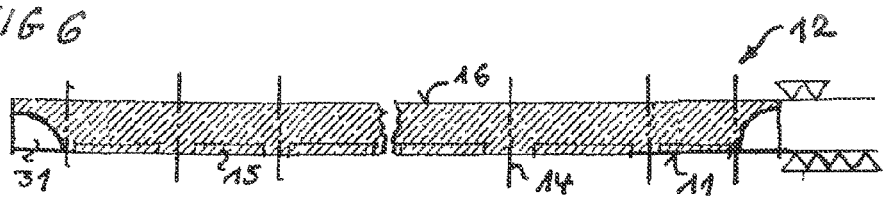

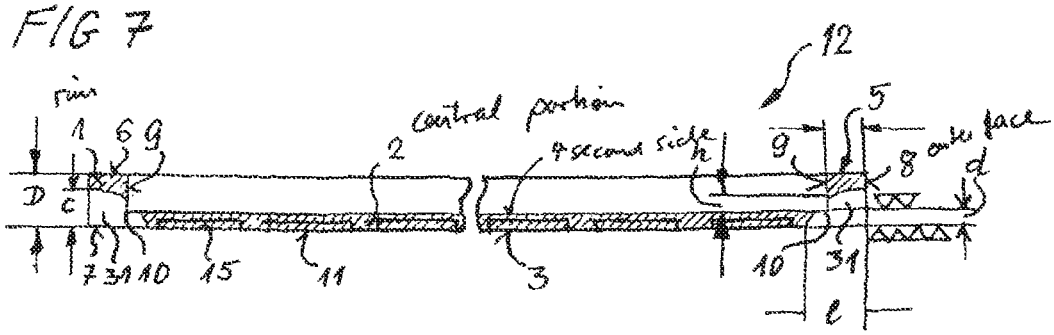
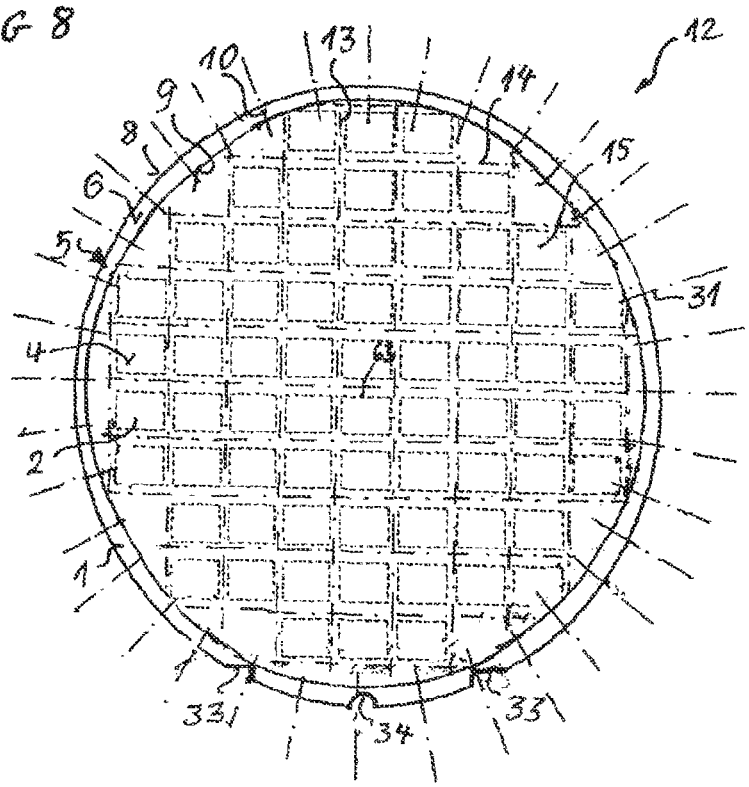

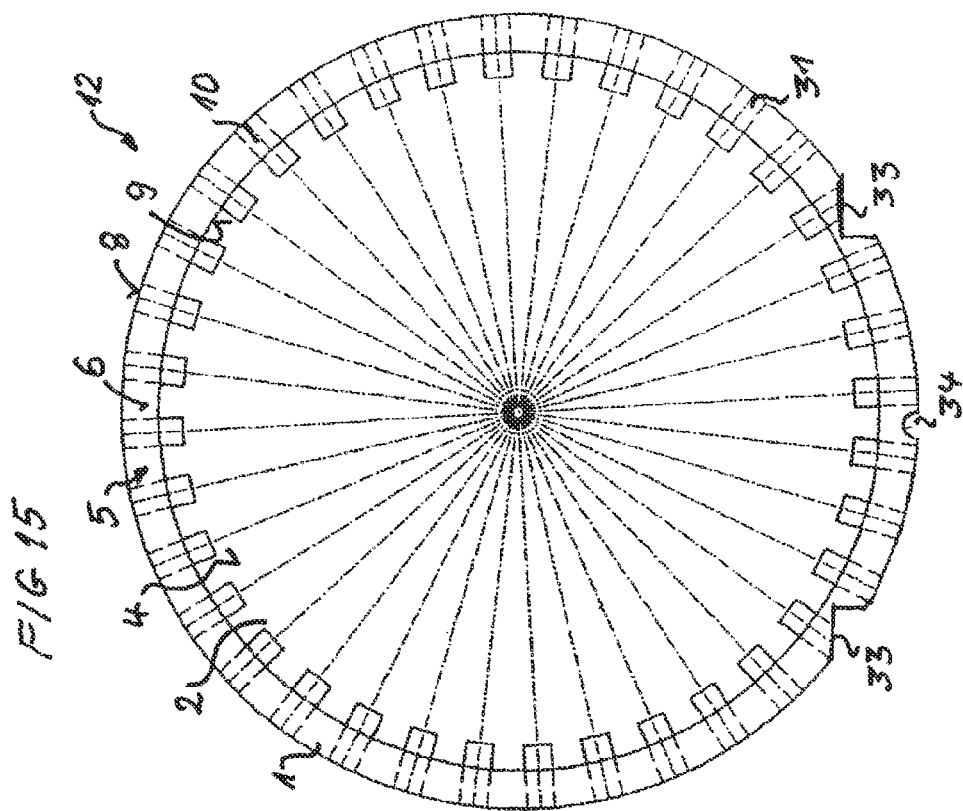

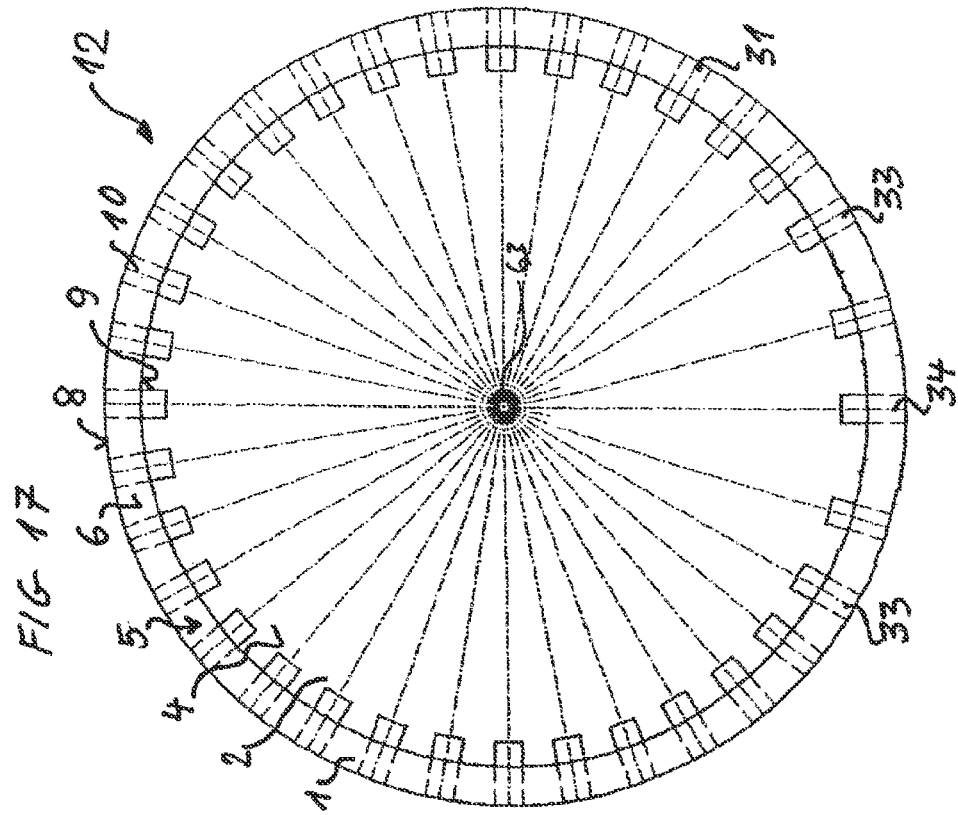
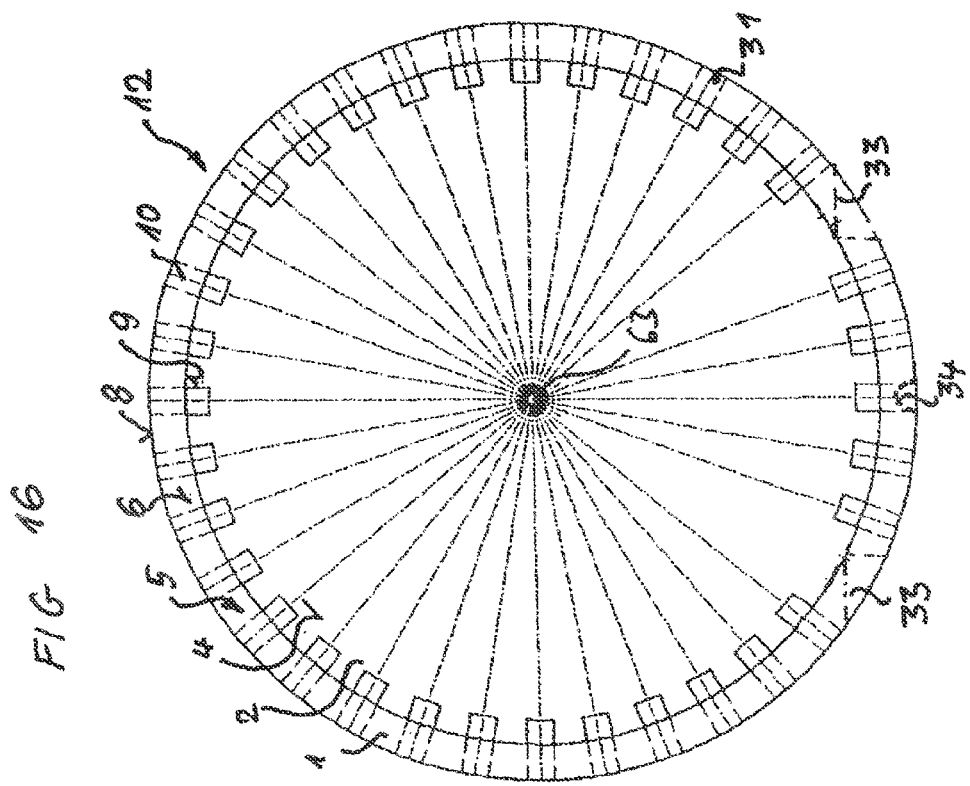

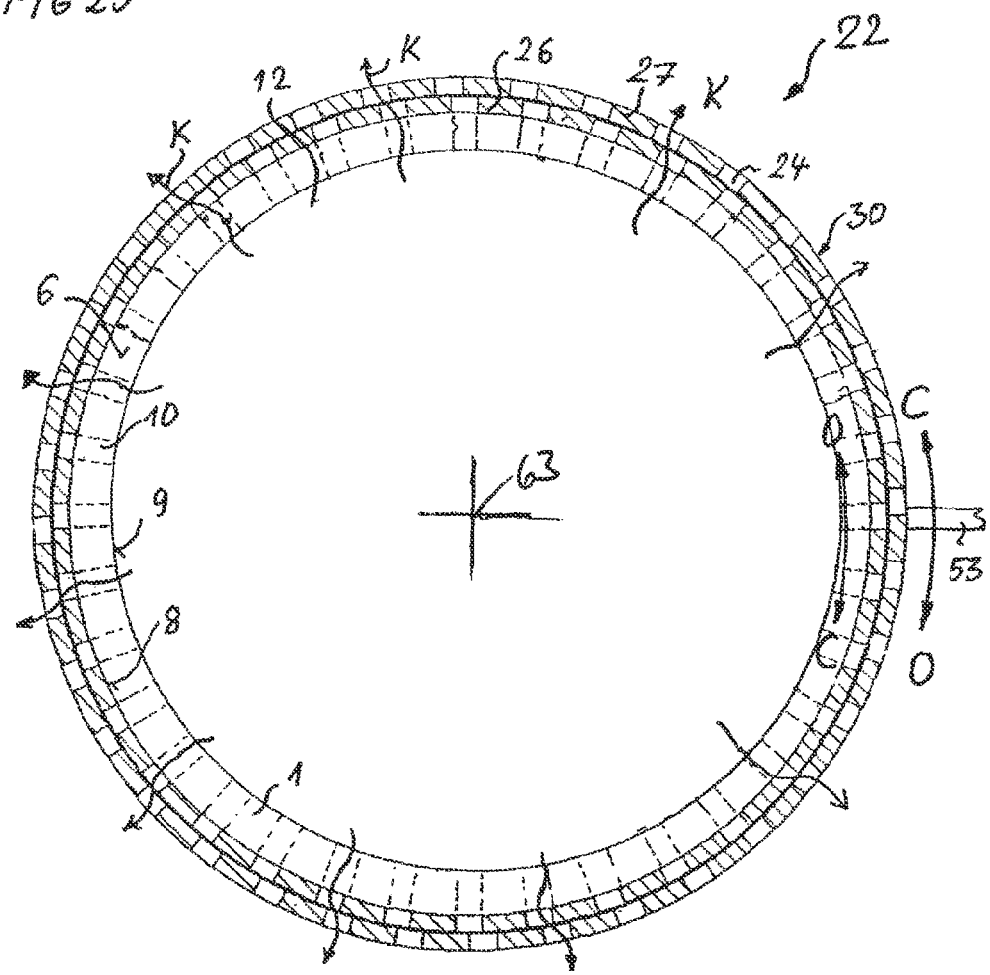
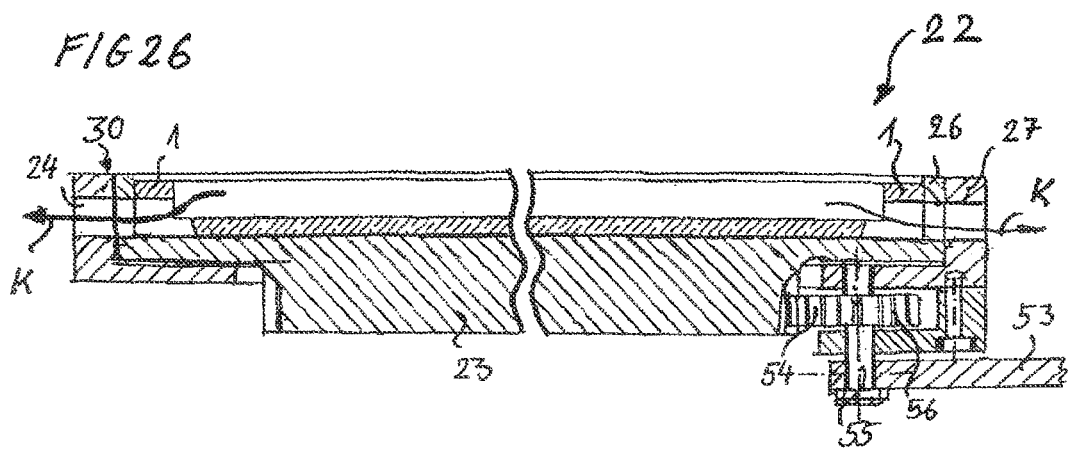

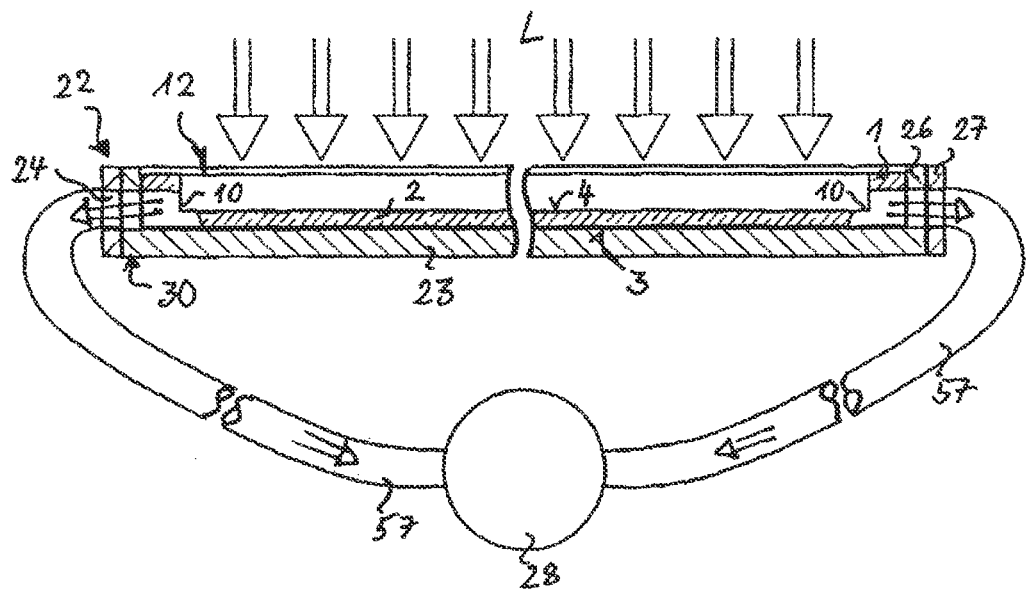
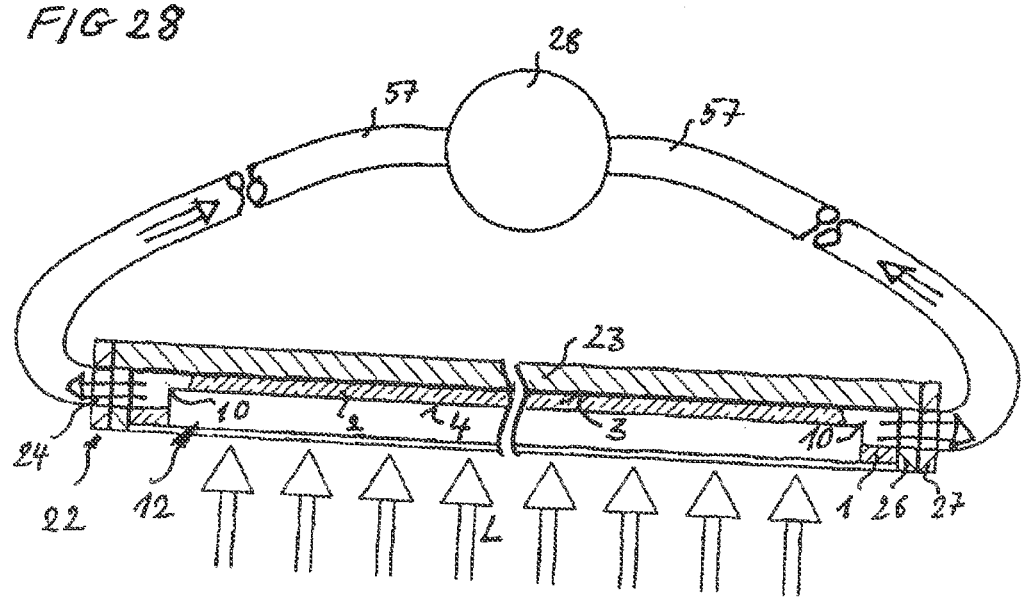

$\varphi = 60°$

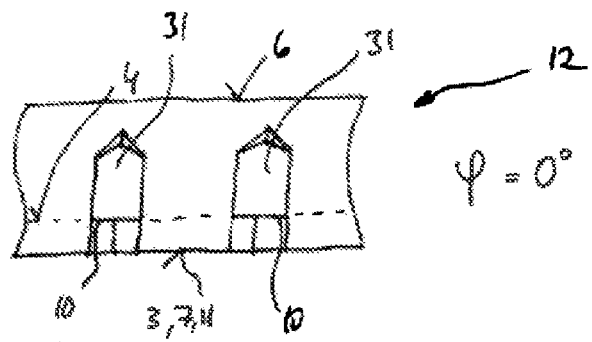
Fig. 36
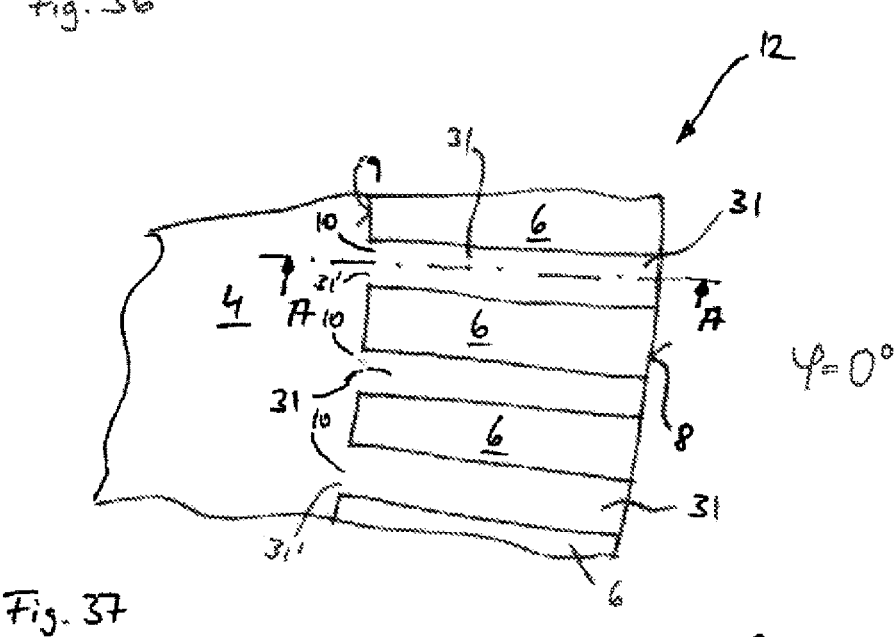
Fig. 37
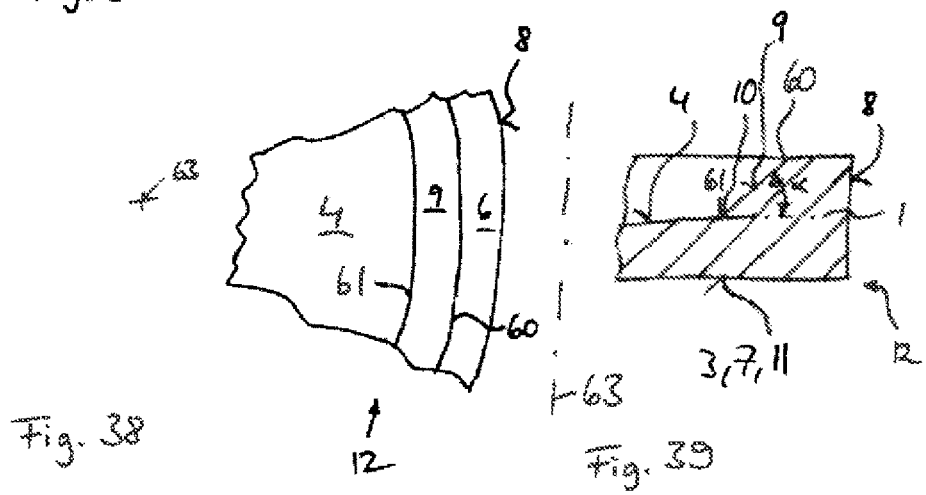
Fig. 38
Fig. 39

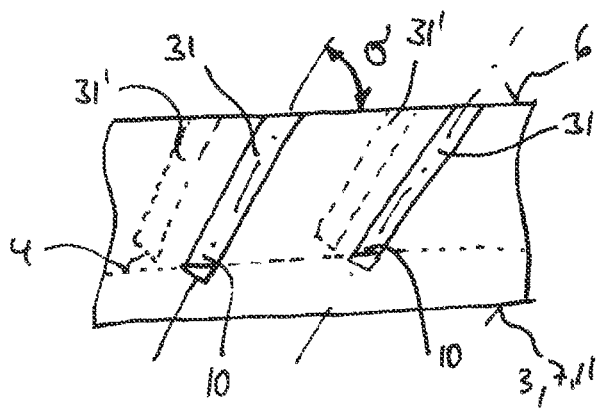
Fig. 43
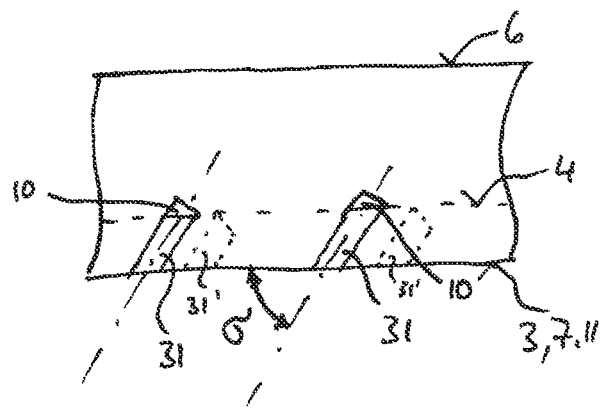
Fig. 4.4
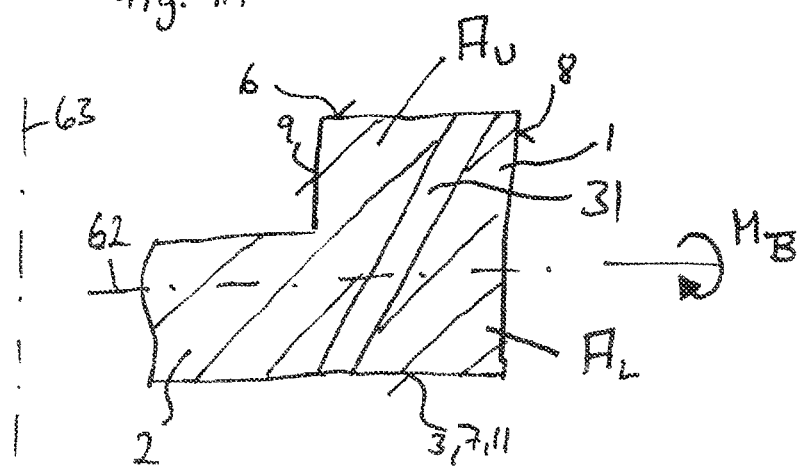
Fig. 45

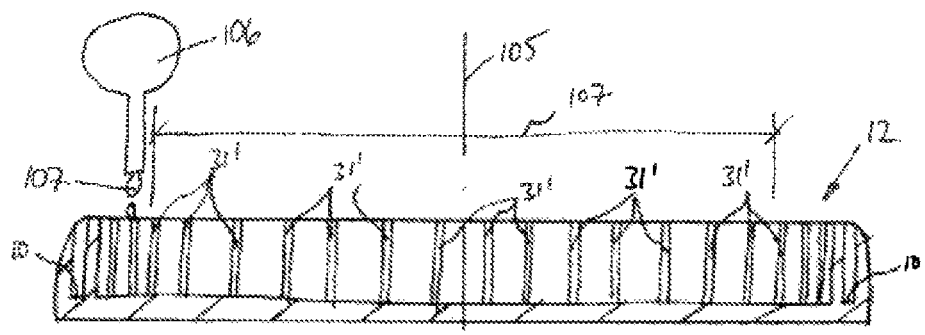
Fig. 48
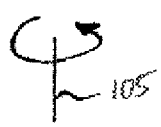
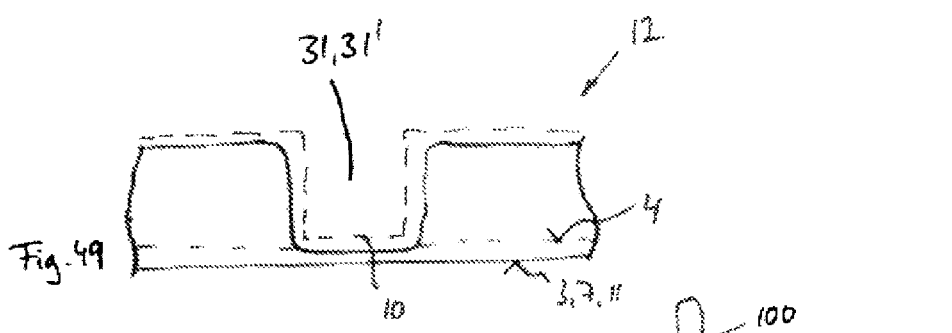
Fig. 49
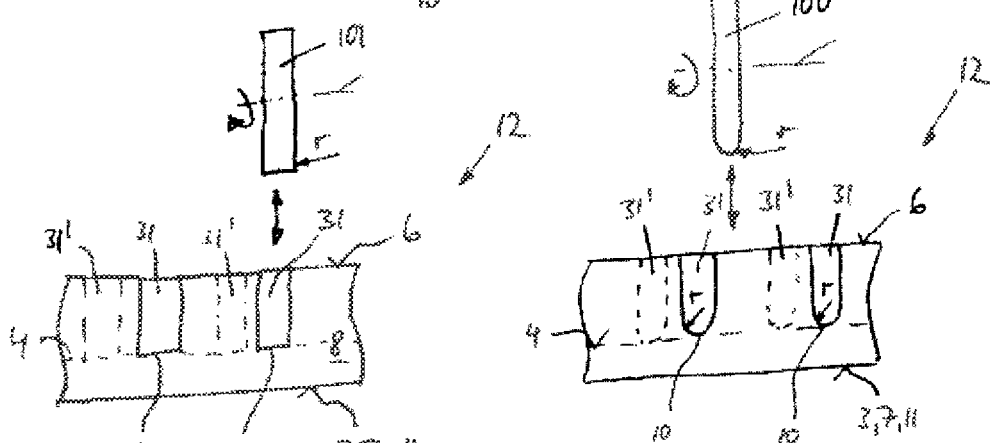
Fig. 46
Fig. 47

SEMICONDUCTOR WAFER AND METHOD FOR PRODUCING SAME

CROSS-REFERENCE TO RELATED APPLICATIONS

This application claims priority to U.S. application Ser. No. 12/994,211, filed May 17, 2011. The content of the above application is incorporated by reference in their entirety.

The present application relates to a semiconductor wafer with a reinforcing structure and to a method for producing said semiconductor wafer. One further aspect of the application relates to a chuck for holding said semiconductor wafer. This semiconductor wafer comprises a thinned central portion having a first side and a second side surrounded by at least one protruding edge portion.

In a known semiconductor wafer, there is provided an annular rim. Said rim comprises a top face, a bottom face, an outer face and an inner face. A method of producing such a wafer with a thin central portion and an annular protruding rim is known from the document US 2008/0090505 A1. A thinned central portion is formed in an area of a rear surface of a standard wafer corresponding to a device formation area on the front side of a processed standard wafer. This thin central portion is performed by grinding with a grinding unit and the annular rim is concurrently formed around said thinned central portion. The annular rim shall increase the stability such that warping of such a thinned central portion of the wafer is avoided.

The application provides a semiconductor wafer with a thinned central portion having a first side and a second side and at least one reinforcement structure for increasing the radial bending resistance of the semiconductor wafer. The reinforcement structure provides one or more passages for a fluid flow between an inner face of said one reinforcement structure towards an outer face of the reinforcement structure. The fluids can be gaseous or liquid.

The reinforcement structures can be provided as elevated areas over the central portion, wherein one or more passages provide an elevated area towards the outer face of the wafer.

Said passages can be slits which separate at least two elevated areas from each other. The slits can also be provided within the elevated areas.

The slits can also be provided with a spatial orientation that includes a horizontal inclination angle σ (sigma) between the slit and a horizontal direction of the wafer at the location of the respective slit. The slits can also be provided with a radial inclination angle φ (phi) between the slit and a radial direction of the wafer.

It is preferred that a spatial orientation of at least one slit is provided such that there is no radial overlap of an inner orifice and a respective outer orifice of the slit. This increases the stability of the wafer.

In a further example, the passage can be a ramp which is provided at the elevated area.

The semiconductor wafer of the application will usually be a standard semiconductor wafer with a thinned central portion which is a planar polished mirror-like front surface of the wafer and said first side comprises a plurality of integrated electronic circuits or semiconductor devices. The second side of said thinned central portion can be a recessed portion of a rear surface the wafer which also comprises a plurality of integrated electronic circuits or semiconductor devices, the first side and the second side having electrical interconnections through TSV holes.

The application also provides a chuck for holding a semiconductor wafer, the chuck comprising a circular base plate surrounded by a chuck rim having perforations, the perforations corresponding to at least one position of said passage of said wafer.

The chuck according can have a double ring structure with an inner ring and with an outer ring, wherein said rings are perforated and rotatable arranged to each other to variegate the cross section of a combined perforation size.

The application also provides a method with
providing a semiconductor wafer comprising a front surface and a rear surface;
producing integrated electronic circuits or semiconductor device structures at the front surface;
providing at least one fluid (can be gas or liquid) passage at a circumference on the front surface extending radially at least from an outer face of the wafer towards an inner face of said wafer;
providing a recess at the rear surface of the wafer to provide a thinned central portion having a first side and a second side surrounded by at least one reinforcement structure.

According to the application, the fluid passage is provided by dicing along a z-axis of the wafer.

The application provides a wafer on which it is easy to build a structured metallization on said second side of the thinned central portion. Any method step comprising rinsing, spraying, stripping or etching by liquids on the second side of said thinned central portion will not cause problems, since these liquids can easily be discharged from at the intersecting corner between said second side of said thinned central portion and said inner face of said rim. This accumulation of liquids makes correctly structured metallization layers possible and avoids contamination problems.

The present application also relates to a semiconductor wafer with a reinforcement structure and to a method for producing said semiconductor wafer. One further aspect of the application relates to a chuck for holding said semiconductor wafer. This semiconductor wafer comprises a thinned central portion having a first side and a second side surrounded by at least one protruding edge portion. Said protruding edge portion comprises a top face, a bottom face, an outer face and an inner face. The protruding edge structure has a plurality of perforations extending radially at least from said inner face of said rim towards said outer face of said protruding edge structure, wherein said top face of said protruding edge structure remains unperforated. An inclination angle of the perforation is applied between 0 and ±60 degrees, between 0 and ±20 degrees, preferably between 5 and ±15 degrees off the radial direction.

Such a semiconductor wafer has the advantage that excess process liquids applied to the second surface of said thinned central portion of said semiconductor wafer can escape or bypass through said plurality of perforations extending radially from the inner face of said protruding edge structure towards its outer face. An accumulation of liquid in the intersection corner between the second surface of said thinned central portion and said inner face of said edge structure is decreased or even avoided and a better planarity of sprayed-on liquids is achieved. Further, contaminations can be avoided.

According to one embodiment of the application, a height of said perforations is larger than the thickness of said thinned central portion. With the increasing height of said perforations the bypassing and escaping of liquids through said perforations are increased.

In an further embodiment, the first side of said thinned central portion and said bottom face of said protruding edge structure provide a planar polished mirror-like front surface of a standard semiconductor wafer. This has the advantage that no intersecting corner between the central thinned portion and the protruding edge structure is present on the first side of said semiconductor wafer, so that standard semiconductor processes can be performed on the first side.

If the wafer provides a double sided recessed portion surrounded by the protruding edge structure, there will be not only an intersecting corner between the second side and the inner face of the protruding edge structure, but also an intersecting corner between the first side of the thinned central portion and said inner face of said protruding edge structure. In this case and in other cases, it is of advantage to provide perforations which are extending in an inclined form radially from said inner face towards said outer face, similar to the orientation of turbine blades in a turbine wheel.

In a further embodiment, said first side of said thinned central portion, which is equal to the front surface of a standard wafer, comprises a plurality of rectangular sections predetermined by notional dividing lines, wherein each section comprises an integrated electronic circuit or a semiconductor device structure. Said second side of the thinned central portion is provided by a recessed portion of a rear surface of a standard semiconductor wafer.

In a further embodiment, said second side of said thinned central portion comprises one metallization structure of a metallization layer. Such a metallization structure can have conducting lines and contact pads or even bumps for providing interconnections on the rear surface of semiconductor chips.

Furthermore, it is possible that said second side of said thinned central portion comprises a plurality of metallization structures comprising insulation layers between said metallization structures and comprising through contacts through said insulation layers. Such complex multilayer metallization structures are possible since excess process liquids can now bypass or escape through said perforated protruding edge structure of the semiconductor wafer.

Preferably said contact bumps comprise a seed layer portion and at least a plated body of a copper alloy coated by a gold or a silver alloy layer. To provide such complex contact bumps on the second side of said thinned central portion several different coating, spraying-on and spinning and rinsing process steps can be successfully processed since the wafer protruding edge structure of the rim comprises said perforations.

Furthermore, it is possible that the semiconductor wafer comprises on each side of a plurality of coordinated rectangular sections determined by dividing lines, wherein each coordinated section comprises an integrated electronic circuit or a semiconductor device structure. In this case, the process of creating integrated circuits has to be applied on both sides of the wafer in a very precise manner supported by alignment marks and wafer orientation marks provided at the wafer A further aspect of the invention is related to a chuck for holding a semiconductor wafer with a reinforcing annular wafer rim, wherein said wafer has a plurality of perforations extending radially at least from an inner face of said wafer towards an outer face of said wafer. A portion of said wafer rim remains unperforated. Said chuck comprises a circular base plate surrounded by a chuck rim having perforations. The base plate of the chuck fits to the semiconductor wafer, and said chuck rim circumferences said wafer. With such a chuck, a secure holding of semiconductor wafer with a thinned central portion is possible.

Furthermore, it is possible to align the perforations of the chuck rim to the perforations of the wafer edge, so that bypassing or escaping of process liquids is enabled. Therefore, the positions of said perforations of said chuck rim correspond to positions of said perforations of said wafer rim.

In a further embodiment of the chuck, the chuck rim has a double ring structure with an inner ring and an outer ring, wherein said rings are perforated and rotatable arranged to each other to vary the size of the cross section of a combined perforation. It is then possible to partially or fully close the perforations as well as to fully open the perforations to a maximum size with such a double ring rim of a chuck. If the maximum opening of the perforation is not enough to secure the bypassing or escaping of liquids it is possible to connect a vacuum container to the chuck rim of said chuck and to support an escaping or a bypassing of excess liquids through said perforations of said wafer rim and said perforations of said chuck rim.

One method for producing a semiconductor wafer with a reinforcement structure comprises the following steps. First, a standard semiconductor wafer is provided. Integrated electronic circuits or semiconductor device structures are produced in a plurality of predetermined rectangular sections in the front surface of the wafer. A plurality of perforations and protruding structures are provided. These perforations and protruding structures are positioned along a circumference of the wafer. These perforations extend radially between an outer face of a predetermined area of the wafer and an inner face of said area, whilst other areas of said wafer remain unperforated, providing protruding portions.

For that purpose at last a recess is ground or etched into the rear surface of said standard wafer with prepared perforations along the circumference of said wafer. With this grinding step, a thinned central portion is provided, having a first side and a second side. This thinned central portion is then surrounded by a protruding annular edge portion. Which in turn can be provided with perforations so that protruding edge structures remain.

One possible advantage of this method is that the perforation structure and the protruding portions are provided after the semiconductor processing steps.

A further method for producing a semiconductor wafer with a reinforcement structure comprises the following steps. First a standard semiconductor wafer is provided. Then, a plurality of perforations and protrusions along a circumference of the wafer is provided. After that, a grinding or an etching of recesses into the surface is done. After that, integrated electronic circuits or semiconductor device structures can be provided on one or two sides o the wafer. These device structures are positioned in a plurality of predetermined rectangular sections.

Said plurality of perforations can be in the form of slits, cut by a dicing saw blade which is inclined radially at least from said outer face of the wafer towards its inner face. A top face of said wafer can remain uncut. Cutting slits for providing perforations is very cost effective and not very complicated, but contaminations of the wafer surfaces during this cutting step might occur. Therefore it is an advantage to cut these slits after semiconductor processing steps are finished and before any thinning of a central portion of the wafer takes place.

Such a cutting can be done such that the cutting depth for said slits is smaller than a thickness of said protruding structure and deeper than a thickness of said thinned central portion. The inclined radial cutting length for said slits can extend into said thinned central portion as minimal as possible if the cutting into said thinned central portion initiates micro cracks.

A modified method to make said plurality of perforations and protrusions is an etch process, which can be a dry etching process preferable by RIE-plasma etching (reactive ion etching). Nevertheless it is also possible to apply a wet etching process to build said plurality of perforations along the circumference of said wafer.

When such a wafer with a perforated protruding structure is provided, it is possible to perform a deposition of a metal or carbon seed layer for a metallization structure or a bump plating structure onto said second side of said thinned central portion. Such a seed layer of metal or carbon may be necessary if the plating structure shall be achieved by an electrochemical plating process. Said metal or carbon seed layer can than be structured to said metallization structure if it is also possible to plate it to said electrical bumps, by at least one of the steps of spray-on and spinning a photo-resist, of spraying-on developing liquids, of sprayed-on etch liquids, of rinsing-on cleaning liquids, of spraying-on stripping liquids, of plating or of coating by electrolytic liquids under bypassing or escaping of excess liquids through said plurality of perforations of said rim.

When said metal or carbon seed layer is structured and plated to said metallization structure and/or to said electrical bumps depositing of a thin metal or carbon seed layer to the second side of the thinned central portion by a sputter process is provided. A sprayed-on and spinning of a resist layer under escaping of excess resist through said perforations is performed. Then a drying the resist layer takes place. The dried layer is structured by exposition through a mask. Then the exposed resist layer is developed by spinning-on developing liquid under escaping of excess resist and excess developing liquid through said perforations.

After these steps, a rinsing of the structured resist layer by spraying-on a rinsing liquid is performed whilst rinsing liquid excess through said perforations. The developed resist structure is then hardened to a plating mask. During the plating process the uncoated resist free seed layer is performed to a metallization structure and/or to metallic bumps in an electrochemical bath by circulating the electrochemical liquid over the structured seed layer and bypassing said liquid through said perforations.

After plating a stripping off of the resist of said plating mask from the second side of the thinned central portion is performed by spraying-on a stripping liquid under escaping of excess stripping liquid and stripped resist through said perforations. Then the stripped structure is cleaned by a cleaning liquid under escaping of excess cleaning liquid through said perforations. Then follows a wet etching of remaining parts of the thin seed layer by spraying-on of an etch liquid under escaping of excess etch liquids through said perforations.

After wet etching, the etched structure rinsed by spraying-on a rinsing liquid under escaping of excess rinsing liquids through said perforations. Finally a cleaning of the second side with bumps is performed by a cleaning liquid under escaping of excess cleaning liquids through said perforations and drying the semiconductor wafer. The results of these method steps are contact bumps positioned on the second side of the thinned central portion, which can be used to stack semiconductor chips one above the other in a very compact manner to form a block of stacked semiconductor devices or a block of stacked integrated circuits.

A semiconductor wafer according to the application has a thinned central portion having a first side and a second side and at least one reinforcement structure for increasing the radial bending resistance of the semiconductor wafer, the reinforcement structure providing at least one passage for a fluid flow between an inner face of said one reinforcement structure towards an outer face of the reinforcement structure.

The passages can be slits which are provided within the elevated areas, the slits being provided with a spatial orientation that includes a horizontal inclination angle σ (sigma) between the slit and a horizontal direction of the wafer at the location of the respective slit. The slits can also be provided with a spatial orientation that provides a radial inclination angle φ (phi) between the slit and a radial direction of the wafer at the location of the respective slit.

Good bending resistance can be obtained when a spatial orientation of at least one slit is provided such that there is no radial overlap of an inner orifice and a respective outer orifice of the slit.

Instead of a slit or in addition to the slit, said passage can comprise a ramp which is provided at the elevated area.

The application provides also a chuck for holding such a semiconductor wafer, the chuck being adapted to the passage in the semiconductor wafer.

The above and other objects, features and advantages of the present application and the manner of realising them will become more appearing and the application itself will best be understood from a study of the following description and appended claims with reference to the attached drawings showing some preferred embodiments of the application.

FIG. 1 shows a schematic front view of a modified semiconductor wafer with alignment marks;

FIGS. 2 to 8 show schematic views illustrating a method for forming a wafer having a recessed and thinned central portion, an annular rim and circumferential perforations;

FIG. 2 shows a schematic cross sectional view of a standard semiconductor wafer;

FIG. 3 shows a schematic cross sectional view according to FIG. 2 after processing of semiconductor device structures;

FIG. 4 shows the cross sectional view of the wafer according to FIG. 3 after sawing inclined radially extending slits into the circumference of the wafer;

FIG. 5 shows a schematic front side view of the wafer according to FIG. 4;

FIG. 6 shows the cross sectional view of FIG. 4 in an upside down position;

FIG. 7 shows the cross sectional view of the wafer according to FIG. 6 after grinding a recess into the rear surface of the wafer;

FIG. 8 shows a schematic back side view of the wafer according to FIG. 7;

FIG. 14 shows a schematic back side view of a modified wafer;

FIG. 15 shows a schematic back side view of a modified wafer;

FIG. 16 shows a schematic back side view of a modified wafer;

FIG. 17 shows a schematic back side view of a modified wafer;

FIG. 25 shows a front view of a wafer holding chuck;

FIG. 26 shows a schematic cross sectional view of the wafer holding chuck according to FIG. 25;

FIG. 27 shows a schematic cross sectional view of a wafer holding chuck with vacuum connections;

FIG. 28 shows a schematic cross sectional view according to FIG. 27 with the chuck in an upside down position.

FIG. 36 shows a schematic view of the semiconductor device structure of FIG. 35 as seen from outside;

FIG. 37 shows a schematic top view of a further semiconductor device structure;

FIG. 38 shows a schematic top view of a further semiconductor device structure which is similar to the semiconductor device structure of FIG. 10;

FIG. 39 shows a schematic cross sectional view of the semiconductor device structure of FIG. 38;

FIG. 43 shows a schematic view of a further semiconductor device structure as seen from outside;

FIG. 44 shows a schematic view of a further semiconductor device structure as seen from outside;

FIG. 45 shows a schematic cross sectional view of a further semiconductor device structure;

FIG. 46 shows a schematic side view of wafer with a notch from a rectangular shaped dicing wheel;

FIG. 47 shows a schematic side view of wafer with a notch from a round shaped dicing wheel;

FIG. 48 illustrates a cross-section of a wafer with an overhead etching liquid dispenser;

FIG. 49 illustrates the shape of slits of the wafer of FIG. 48 before and after etching;

Figure 56:
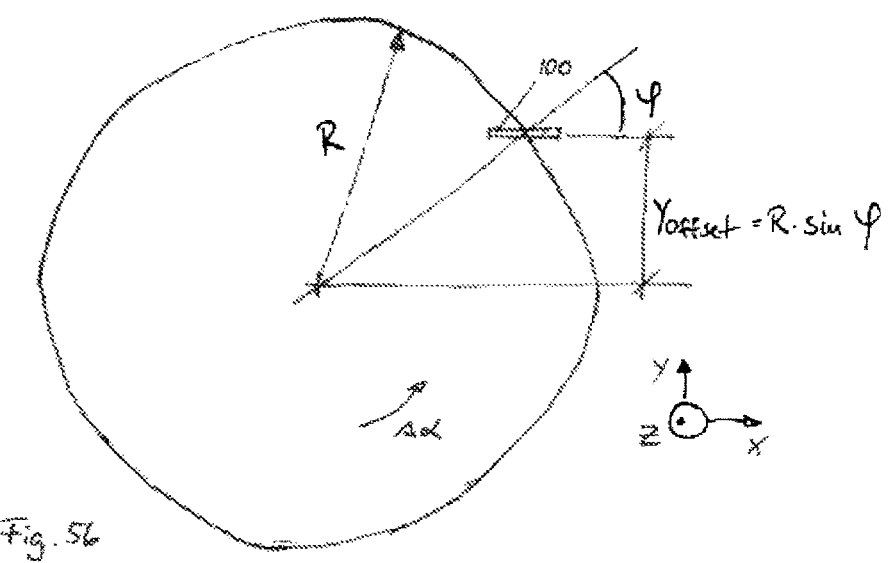
Figure 52:
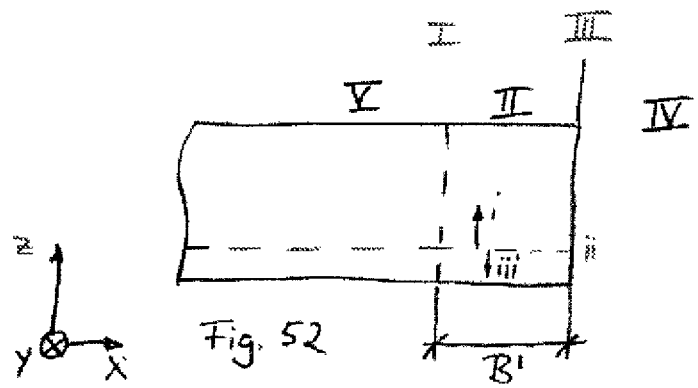

FIGS. 52, 53, 54, and 55 illustrate variations which can be obtained by moving the dicing wheel along the z-axis whereas each cut is done at different z or x positions, and different diameters of the dicing wheel;

FIG. 56 illustrates the calculation of an offset value Y; and

Figure 57:
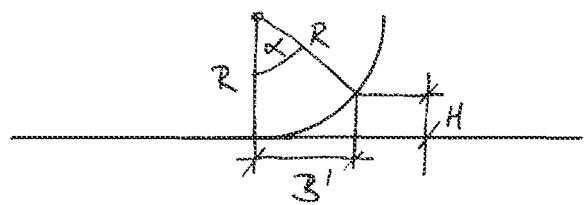

FIG. 57 illustrates calculating the elevation of the slit at the outer edge of the wafer.

FIG. 1 shows a schematic front view of a modified semiconductor wafer 12 with orientation marks 33 instead of a standard orientation line 38. The orientation marks 33 relate to the crystal orientation of the mono crystalline silicon wafer 12 and are very small marks compared to said orientation line 38 of a conventional semiconductor wafer. These small orientation marks 33 can be cut or etched into a predetermined area on the circumference of said wafer 12. Furthermore, FIG. 1 shows an alignment mark 34 to ease the adjustment of said wafer 12 to a wafer chuck. Most recently, orientation marks are omitted and simply replaced by an alignment notch, since wafers with diameters above 200 mm are delivered with just one standard <100> crystal orientation.

In the center of the wafer 12, its virtual symmetry axis 63 is provided in FIG. 1.

FIGS. 2 to 8 show schematic views illustrating one of the several possible methods for forming a wafer having reinforcement structures of segments with perforations between them and with a recessed thinned central portion.

FIG. 2 shows a cross sectional view of a standard silicon semiconductor wafer 40 having a thickness D in the range of 600 to 700 µm (micrometer) and a radius r of about 50 to 150 mm (millimeter). Furthermore, this standard silicon semiconductor wafer comprises a polished mirror-like front surface 11 and a ground rear surface 16. Said polished mirror-like front surface 11 is provided to introduce structures of integrated circuits or structures of semiconductor devices by known processes of the semiconductor technology.

FIG. 3 shows the cross sectional view according to FIG. 2 after processing of semiconductor device structures or said integrated circuits 15 onto the polished mirror-like front surface 11 of the standard semiconductor wafer 40. The dashed lines are virtual dividing lines 14 of a dicing saw, which later divides said semiconductor wafer 40 into semiconductor chips of integrated circuits 15 or into semiconductor chips of semiconductor devices. For connecting the front face and the rear face of a semiconductor chip with integrated circuits by electrically conducting vias at a later time, it is possible to etch blind holes into the polished surface before grinding is performed. These holes can be plated with conducting layers. After grinding and thinning of said wafer, the vias can be connected to a conducting structure which is later provided at the rear side of said wafer (not shown here).

FIG. 4 shows the cross sectional view of the wafer 40 according to FIG. 3 after sawing radially extending slits 31 into the circumference of the wafer. This cutting step will end up with a modified semiconductor wafer 12 as shown in FIG. 5. The slits 31 are sawn by a dicing saw blade 32, which is moved in the direction of arrow A and simultaneously in the direction of arrow B. The sawing length 1 is limited by the area of integrated circuits 15 and the cutting depths c in the direction B is limited by the thickness D of the semiconductor wafer and the condition, that a predetermined rim shall be provided with an unperforated top face. Instead of a cutting step an etching step is alternatively possible, to provide a perforated rim. Further it is preferred to apply an etch step after sawing for stress release and minimisation of crystal defects.

In an embodiment which is not shown here, an inclination angle Ψ is applied between 0 and ±20 degrees, preferably between 10 and ±15 degrees, off the radial direction. The inclining angle Ψ is illustrated in the lower right part of the wafer with an inclined slots drawn with a dotted line in FIG. 5.

FIG. 5 shows a schematic front side view of the wafer 12 according to FIG. 4 after finishing the perforation cuts to the circumference of the wafer 12. The pitch between two perforation cuts or slits 31 is governed by an angle α of 11.75° (Degree) in this embodiment, which results in 32 cuts of equidistant perforations 10 around the front surface 11 of the wafer 12. The active area of this wafer 12 provides virtual rectangular sections 13 surrounded by virtual dividing lines 14 for a dicing saw blade. In this embodiment, an integrated circuit 15 is arranged in each rectangular section.

FIG. 6 shows the cross sectional view of the wafer 12 according to FIG. 4 in an upside down position. The front surface 11 is now in a down position, comprising said integrated circuits 15, whilst the ground rear surface of the wafer is now in an upside position, so that a grinding stone can be applied to this rear surface 16 to produce a thinned central portion at the backside of the integrated circuits 15.

FIG. 7 shows the cross sectional view of the wafer 12 according to FIG. 6 after grinding a recess into the rear surface 16 of the wafer 12. A recessed central thinned portion 2 can be produced by said grinding with a first side 3 comprising the integrated circuit 15 and a second side 4, which forms the backside of said integrated circuits 15. An annular rim 1 will be produced by grinding such a recess, wherein the rim provides a top face 6, which is part of the original rear surface 16 of the wafer. Further, the rim 1 has a bottom face 7, which is in this embodiment coplanar with the front surface 11 of the wafer. Further, said rim has an outer face 8, which is identical with the outer circumference area of the wafer. An inner face 9 is produced during the grinding of said recessed thinned central portion 2 of the wafer 12. Openings of perforations 10 are processed with grinding the inner face 9 in the range of the slits 31. These perforations 10 allow a bypassing and an escaping of processing liquids during the preparation of the back side of the different integrated circuits 15 or semiconductor device structures.

FIG. 8 shows a schematic back side view of the wafer according to FIG. 7. The rim 1 surrounds said thinned central portion 2, which is shown with its second side 4, so that the integrated circuits 15 are shown with dashed lines. Since the top face 6 of the rim 1 providing an annular edge portion 5 is unperforated, the perforations 10 are only shown by inclined radial extending dashed lines. The orientation marks 33 and the adjustment mark 34 are smaller than the width w of the rim 1, so that a top face 6 of the rim 1 is not disturbed.

Figure 9:
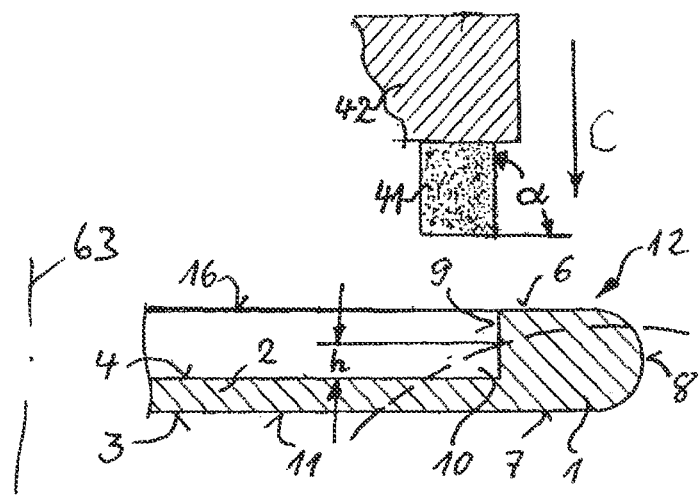
FIG. 9 shows a schematic cross sectional view of a grinding stone to grind a recessed central portion.

FIG. 9 shows a schematic cross sectional view of a grinding stone 41 to grind a recessed thinned central portion 2. This grinding stone 41 is fixed to a rotatable grinding stone holder 42. This grinding stone holder 42 is moved in the direction of arrow C to grind into the rear surface 16 of the wafer 12 said thinned central portion 2 with a second side 4 and an intersection between said section side 4 and said inner face 9 of said rim 1. Since the grinding stone 41 has a grinding angle α of 90°, the intersection between the second surface 4 and the inner face 9 of the rim 1 is also rectangular. This causes the above mentioned agglomeration of process liquids and contaminations unless perforations can be provided by a dicing saw blade which contour is marked by a dashed line.

Figure 10:
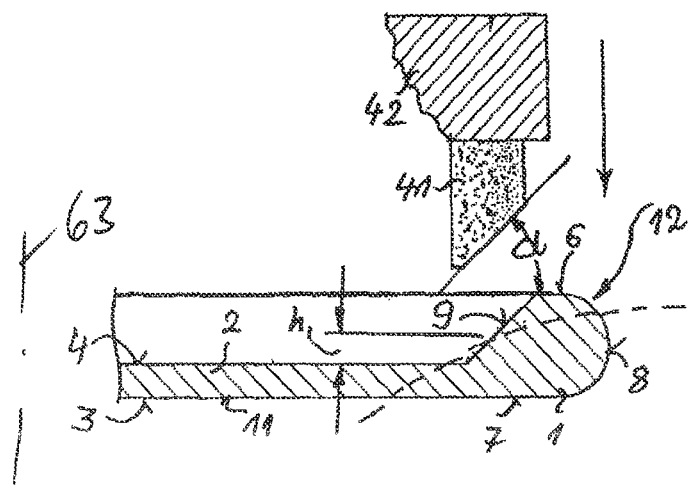
FIG. 10 shows a schematic cross sectional view of a modified grinding stone.

FIG. 10 shows a schematic cross sectional view of a modified grinding stone 41 providing a smooth intersection between the second surface 4 of the thinned central portion 2 and the inner surface 9 of the rim 1 produced by an grinding angle α of 45° in this example. Though this smooth intersection decreases the problem of agglomeration of process liquids as well as the agglomeration of contaminations, the area for the rim of such a smooth intersection has to be larger and the area for integrated circuits will be smaller than by an abrupt intersection like in FIG. 9. Therefore it is reasonable to provide the rim 1 with a sufficient number and a sufficient size of perforations around the circumference of the wafer 12.

Figure 11:
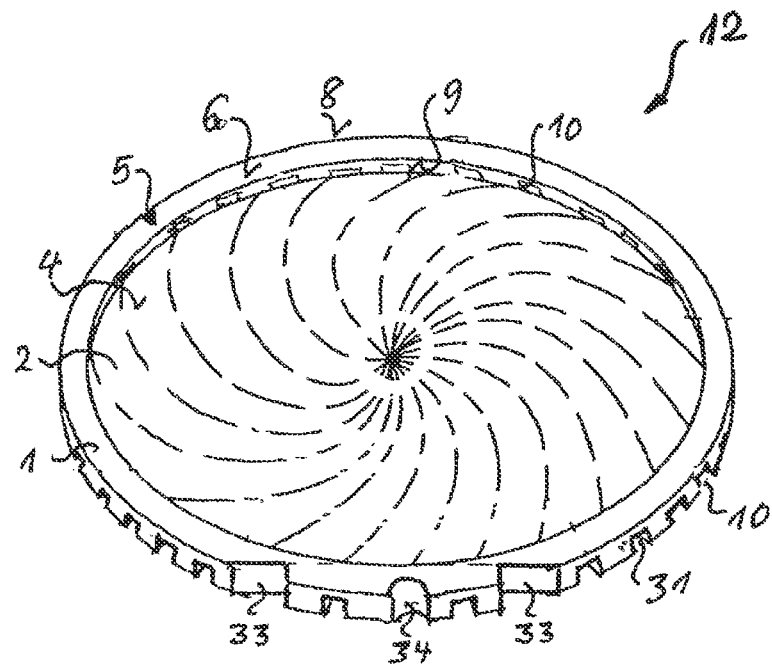
FIG. 11 shows a schematic perspective view of a perforated semiconductor wafer.

FIG. 11 shows a schematic prospective view of a perforated semiconductor wafer 12. Again the thinned central portion 2 is surrounded by a rim 1, which has an unperforated top face 6 and an outer face 8 as well as an inner face 9, which shows the perforations 10. At the outer face 8 of the rim 1 orientation marks 33 and an adjustment mark 34 are positioned without disturbing the top face 6 of the rim 1.

Figure 12:
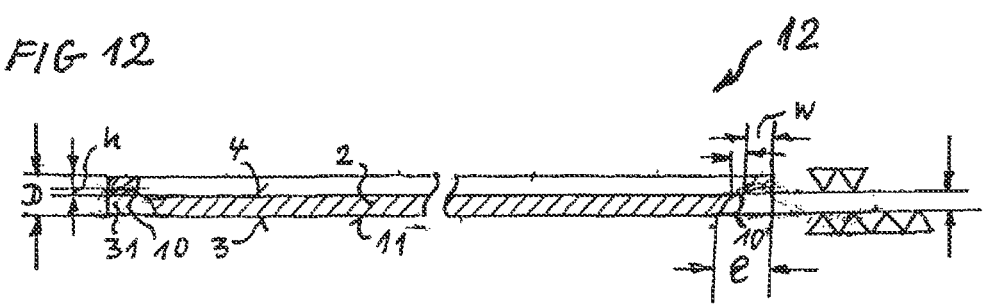
FIG. 12 shows a schematic cross sectional view of the wafer according to FIG. 11.

FIG. 12 shows a schematic cross sectional view of the wafer according to FIG. 11. In this case the wafer 12 has only one recessed portion to build said thinned central portion 2, whilst in the next figure a modification of this thinned central portion is shown.

Figure 13:
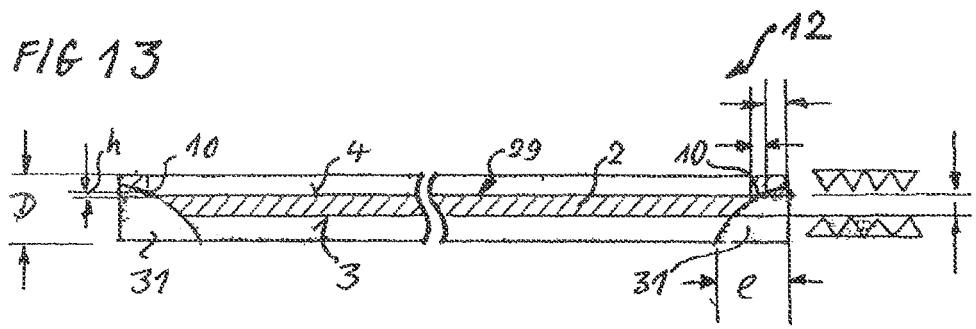
FIG. 13 shows a schematic cross sectional view of the wafer according to FIG. 11 having a double recessed central portion with a surrounding rim.

FIG. 13 shows a schematic cross sectional view of a double recessed central portion 29 of a wafer 12. In this case a grinding and/or an etching of recesses is provided into the rear surface 16 of the wafer 12 and into the front surface 11 of the wafer 12. This double recessed thinned central portion 29 has a first side 3 and a second side 4 surrounded by a protruding annular edge portion 5 to provide an annular rim 1. In this embodiment a semiconductor processing can be performed on both sides 3 and 4 after the grinding process is finished.

FIGS. 14 to 17 show schematic back side views of modified wafers comprising different orientation mark and/or adjustment mark arrangements. The wafer 12 of FIG. 14 has an orientation line 38 providing a very small width W compared to the width of an orientation line of a standard semiconductor wafer. This small width should be small enough to gain a continuous unperforated top face 6 of the rim 1. The perforations 10 in this embodiment have a pitch angle of just 10°, so that 36 perforations 10 are positioned on the annular rim 1.

FIG. 15 shows a schematic back side view of modified wafer 12, which comprises the orientation marks and the alignment mark shown in FIG. 1. The alignment marks provide only small cuts into the annular rim 1. Therefore the width W from a left side orientation mark 33 to a right side orientation mark 33 can be wider than in FIG. 14.

FIG. 16 shows a schematic back side view of modified wafer 12, which provides buried orientation and alignment marks 33 and 34. These marks do not disturb the unperforated top face 6 of the wafer rim 1.

FIG. 17 shows a schematic back side view of a modified wafer 12. The orientation and the alignment marks are achieved by varying the pitch angle of some perforations 10, so that a chuck with corresponding feather keys can be adjusted to said wafer.

The next FIGS. 18 to 24 show some steps to form a structured metallization on the second side 4 of said thinned central portion 2 of a wafer 12.

Figure 18:
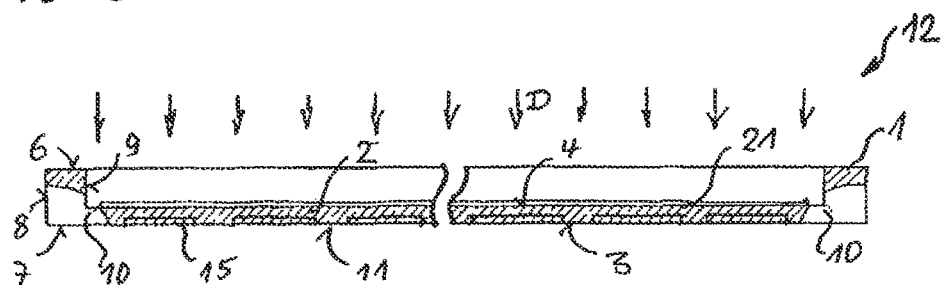
FIG. 18 shows a schematic cross sectional of the wafer view according to FIG. 7 after depositing a seed layer to the second side of the thinned central portion.

FIG. 18 shows a schematic cross sectional view according to FIG. 7 after depositing a seed layer 21 onto the second side 4 of the thinned central portion 2. This seed layer 21 of a thickness of several nanometers increase the conductivity of the second side 4 of the thinned central portion 2 and provides an electrical contact for an electrochemical plating of metallization structures or bumps to the second side 4 of the thinned central portion 2. This seed layer 21 can be sputtered-on to the second surface 4 or can be deposited by a metal or carbon deposition process.

Figure 19:
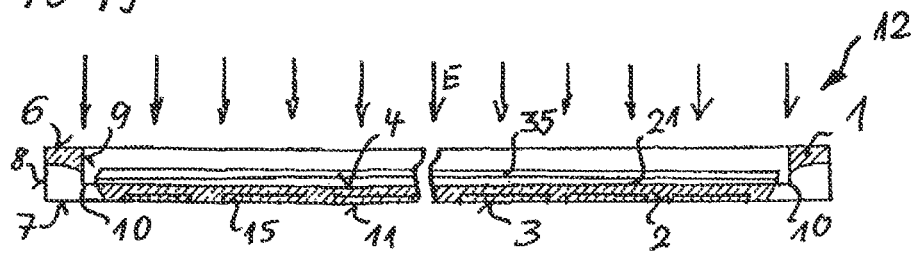
FIG. 19 shows the schematic cross sectional view of the wafer according to FIG. 18 after depositing a resist layer to the seed layer.

FIG. 19 shows the schematic cross sectional view according to FIG. 18 after depositing a resist layer 35 to the seed layer 21. This resist layer has to be structured to form a plating mask before creating bumps or metallization structures on the seed layer by plating.

Figure 20:
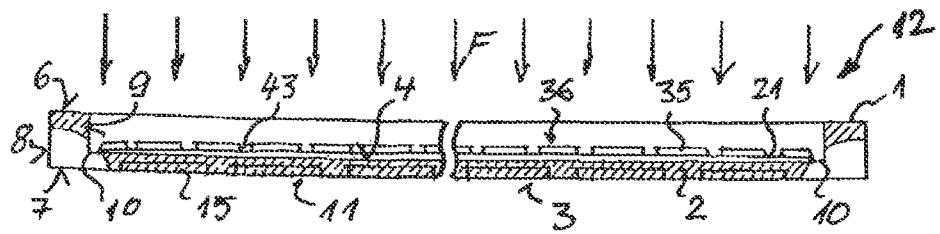
FIG. 20 shows the schematic cross sectional view of the wafer according to FIG. 19 after an exposition step and a development step for processing openings into the resist layer.

FIG. 20 shows the schematic cross sectional view according to FIG. 19 after an exposition step and a development step for openings 43 of the resist layer. With the development step a developing liquid is sprayed-on in the arrow direction F onto the resist layer 4 in the thinned central portion 2 of the wafer 12 and the excess developing liquid can bypass or escape through said perforations 10 of the rim 1 of the wafer 12.

Figure 21:
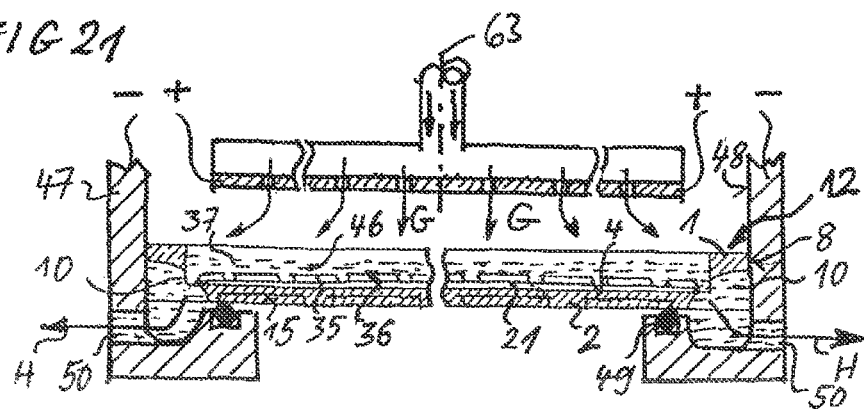
FIG. 21 shows a schematic view of a plating process for bumps plated in said openings of said resist layer.

FIG. 21 shows a schematic view of a plating unit for bumps to the second side 4 of the thinned central portion 2 of the wafer 12. This plating unit has a spraying nozzle 44 with a perforated copper plate 45. This copper plate 45 is connected to the positive potential of a direct current source and an electrochemical liquid is sprayed-on through said perforated copper plate 45 in the direction of arrow G and forms a liquid film 46 as an electrochemical bath 37 on the second surface 4 of the thinned central portion 2 of the wafer 12.

The wafer 12 is positioned inside a container 47. The outer face 8 of the rim 1 fits to the inner face 48 of the container 47, which is connected to the negative potential of the direct current source. The wafer 12 is positioned at the bottom of the container 47 and a conductive seal 49 is liquid tight contacting the second side 3 of the wafer 12, so that copper ions can decorate and plate the free portions of the seed layer 21 through said openings 43 of said resist layer 35, which acts as a plating mask 36. The excess liquid of the electrochemical bath 37 can bypass and escape through the perforation 10 of the wafer 12 and through openings 50 of the container 47. If the container 47 is rotated with the wafer 12 the excess processing liquid can escape supported by centrifugal force in the direction of arrows H.

Figure 22:
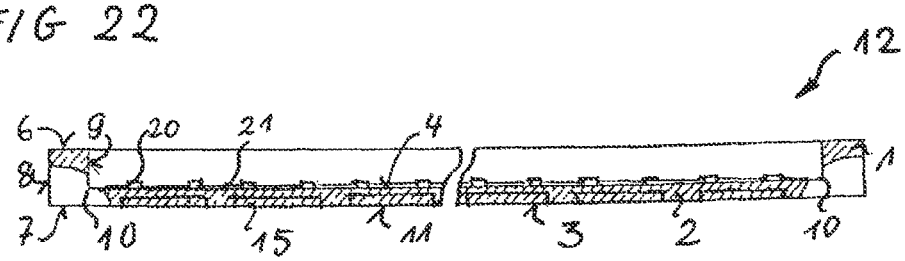
FIG. 22 shows a schematic view of the wafer according to FIG. 21 after stripping-off a resist mask.

FIG. 22 shows a schematic view of the wafer 12 according to FIG. 21 after stripping-off the resist. For stripping-off the resist a stripping liquid is sprayed-on to the second side 4 of the thinned central portion 2 and can escape through the perforation 10 of the wafer 12. The plated bumps 20 are then shown on the seed layer 21 of the second side 4 of the thinned central portion 2 of the wafer 12. To avoid a short circuit by the remaining seed layer 21, the seed layer has to be etched by an etch liquid.

Figure 23:
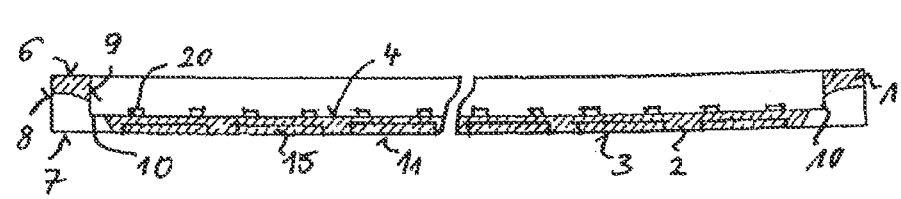
FIG. 23 shows a schematic view of the wafer according to FIG. 21 after etching the seed layer.

FIG. 23 shows a schematic cross sectional view of the wafer 12 according to FIG. 21 after etching the seed layer. During this etching the etch liquid can escape or bypass through the perforations 10 of the wafer 12 and after etching a rinsing is necessary, so that a sprayed-on rinsing liquid also bypasses and escapes through these perforations 10.

Figure 24:
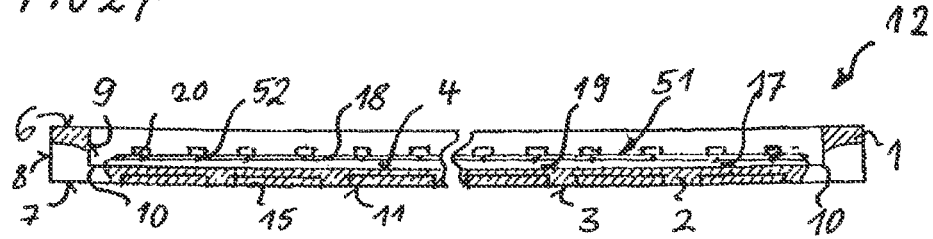
FIG. 24 shows a schematic cross sectional view with a multilayer structure on the second side of the thinned central portion of the wafer.

FIG. 24 shows a schematic cross sectional view of the wafer 12 with a multilayer structure 51 on the second side 4 of the thinned central portion 2 of the wafer 12. This multilayer structure 51 can have a plurality of metallization layers 17 with conducting lines and with insulation layers 18 between said metallization layers 17. It is also possible, that on top of this multilayer structure 51 bumps 20 are positioned with through contacts 52 through the different insulation layers 18 toward the metallization layers 17. The formation of said multilayer structures 51 requires a lot of spraying-on of processing liquids, which now can be bypassed or escape through the perforated rim 1 of wafer 12.

FIG. 25 shows a front view of a wafer holding chuck 22. The wafer holding chuck 22 is able to support and hold a semiconductor wafer 12 as shown in FIG. 22 with a reinforcing annular wafer rim 1, wherein said wafer rim 1 has a plurality of perforations 10 extending radially at least from an inner face 9 of said rim 1 towards an outer face 8 of said rim 1. A top face 6 of said wafer rim 1 remains unperforated. Said chuck 22 comprises a circular base plate to support the semiconductor wafer 12 surrounded by said chuck rim 30 having perforations 24. The base plate of the chuck 22 fits to the semiconductor wafer and said chuck rim 30 circumferences said wafer rim 1.

The embodiment of the chuck 22 according to FIG. 25 shows, that the chuck 22 provides a chuck rim 30 comprising a double ring structure with an inner ring 26 and an outer ring 27, wherein said rings 26 and 27 are perforated and rotatable arranged to each other to variegate the cross section of a combined perforation size. With a handle 53 the rings 26 and 27 can be moved in a close direction C or in an open direction O up to an maximum opening of the perforations 24. Process liquids can therefore bypass or escape through the perforation 10 of the wafer rim 1 and the perforations of the rings 26 and 27 of the chuck rim 30 in a direction of arrows K.

FIG. 26 shows a cross sectional view of the wafer holding chuck 22 according to FIG. 25. On the right hand side of the FIG. 26 the handle 53 is shown, which cooperates with a gear 54. The gear 54 has a gear wheel 56 connected to said handle 53. The gear wheel 56 has a small tooth number. The gear wheel 56 matches with a toothed portion of the base plate 23. The bearings of the shaft 55 of the gear wheel 56 are arranged to the outer ring 27 of the chuck rim 30, so that by moving the handle 53 said variegating of a combined crossed section size of the perforations 24 of the chuck rim 30 is possible.

FIG. 27 shows a schematic cross sectional view of a wafer holding chuck 22 with a vacuum connection 57. This vacuum connection 57 supports the bypassing and escaping of processing liquids L form the second side 4 of the thinned central portion 2 of the wafer 12 through the perforations 10 at the wafer rim 1 and through the perforations 24 of the chuck rings 26 and 27. This vacuum connection 57 sucks the processing liquids towards a vacuum container 28, where the processing liquids can be collected and recycled.

FIG. 28 shows a schematic cross sectional view according to FIG. 27 with the chuck 22 in an upside down position.

This FIG. 28 demonstrates, that a chuck is also applicable in an upside down position, especially when it is supported by a vacuum connection 57 toward vacuum container 28.

FIGS. 29, 30, 31, and 32 show a further semiconductor device structure. Parts which are similar to parts of the aforementioned semiconductor device structures have the same reference numbers.

Figure 29:
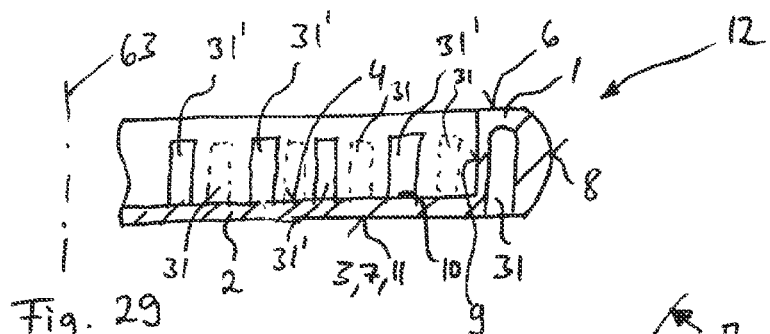
FIG. 29 shows a schematic cross sectional view of a further semiconductor device structure.
Figure 30:
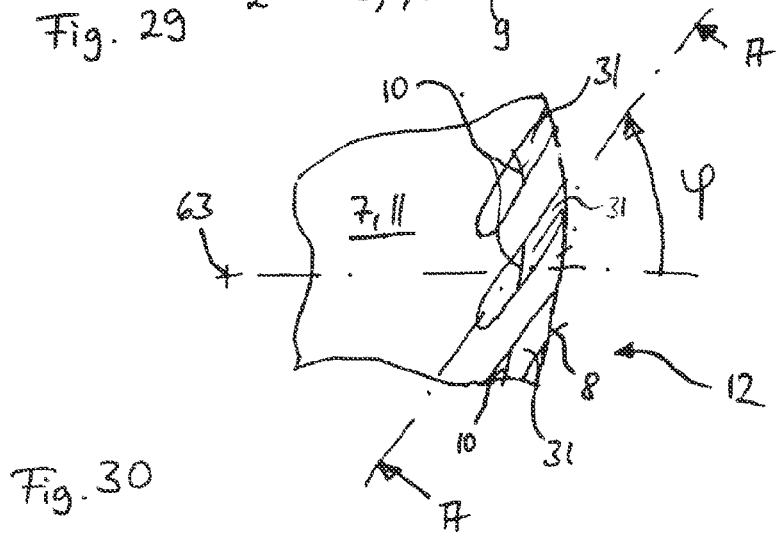
FIG. 30 shows a schematic bottom view of the semiconductor device structure of FIG. 29.

As one can see best in FIG. 30 from a bottom side of the wafer 12, the slits 31 are provided such that they intersect with the central portion 2, cutting the bottom face 7 and the outer face 8. The top face 6 on the upper side of the wafer 12 is not cut. The semiconductor device structure of the FIGS. 29 to 32 is insofar similar to the semiconductor device structure of FIG. 7. This provides reinforcement structures as elevated areas over the central portion 2, the reinforcement structures comprising parts of the rim 1.

Different from the semiconductor device structure of FIG. 7, the slits 31 semiconductor device structure of the FIGS. 29 to 32 are provided in with a spatial orientation that provides a radial inclination angle φ (phi) between each slit 31 and a radial direction of the wafer 12 at the location of the respective slit 31. It turned out that this can provide an improvement of the stability of the wafer 12.

Figure 31:
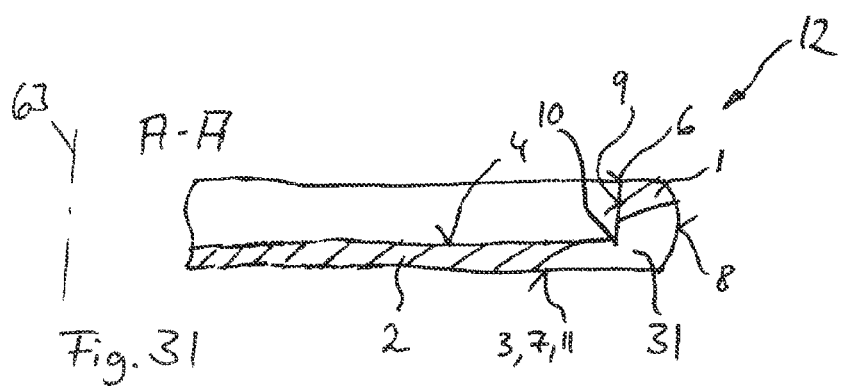
FIG. 31 shows a schematic view of the semiconductor device structure of FIGS. 29 and 30 along a cut line A-A.

FIG. 31 shows a cut section through a line A-A in FIG. 30. FIG. 31 illustrates the passage from the outer face 8 to the inner face 9 of the wafer 12 which is provided through the slits 31.

Figure 32:
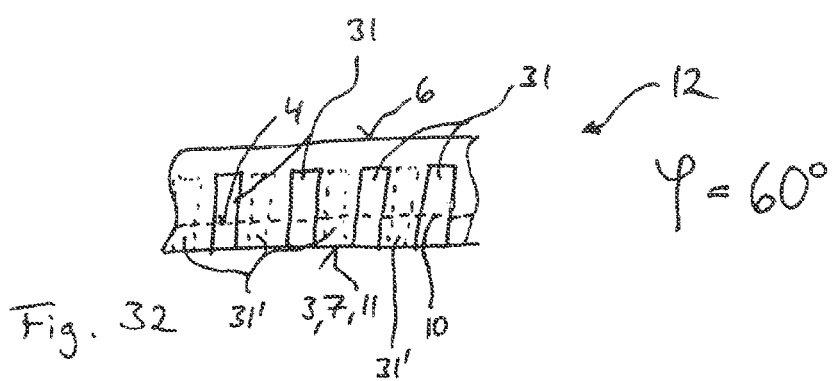
FIG. 32 shows a schematic view of the semiconductor device structure of FIGS. 29 to 31 as seen from outside.

FIG. 32 together with FIG. 29 illustrates the impact of the inclined orientation of the slits 31 on the flexibility of the wafer 12. The slits 31 have inner orifices 31' which are—in a radial direction of the wafer 12—out-of-line not with outer orifices of the same slits 31. That means that one cannot see completely through a slot 31 when looking into a radial direction of the wafer 12. If the radial inclination angle φ is chosen properly, here as 60° (degrees), the effective geometrical moment of inertia of the radial cross section of the wafer 12 is different as compared with the design of FIG. 12. One way to choose the radial inclination angle φ is to provide the slits in such a way that there is no radial overlap between the inner orifice 31' and the respective outer orifice of the slits 31. This means that if one is looking from an outside of the wafer 12 through the slits 31 in a radial direction, one cannot see the inner orifice 31' but only the inner walls of the slits 31 within the rim 1 of the wafer 12.

Figure 33:
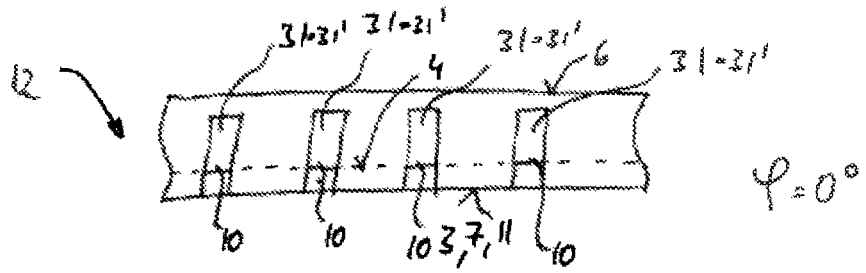
FIG. 33 shows a schematic view of the semiconductor device structure of FIGS. 7 and 8 as seen from outside.

For a better comparison, FIG. 33 shows the a view of the wafer 12 of FIG. 7 from outside which corresponds with the view of the wafer 12 of FIG. 32. As one can see in FIG. 33, the radial inclination angle φ is here 0° (degrees), so that there is a full radial overlap of the inner orifice 31' and the respective outer orifice of the slits 31. If their dimensions of the wafer 12 and the slits 31 are the same, the effective geometrical moment of inertia of the radial cross section of the wafer 12 of the FIGS. 19 to 32 is different from the corresponding geometrical moment of inertia of the wafer of FIG. 7.

It is believed that not only does the actual size of the geometrical moment of inertia of the radial cross-section of the wafer plays a role. The smallest absolute size of the radial geometrical moment of inertia along the circumference of the wafer is important, too, because a breaking of the wafer often occurs at the location of the smallest radial geometrical moment of inertia. An appropriate location and orientation of the slits in the rim of the wafer can improve this behaviour.

It can be of further advantage to place the slits into a direction which is different from the crystallographically preferred or main breaking lines along the main symmetry axes of the crystal which was used for manufacturing the wafer.

Figure 34:
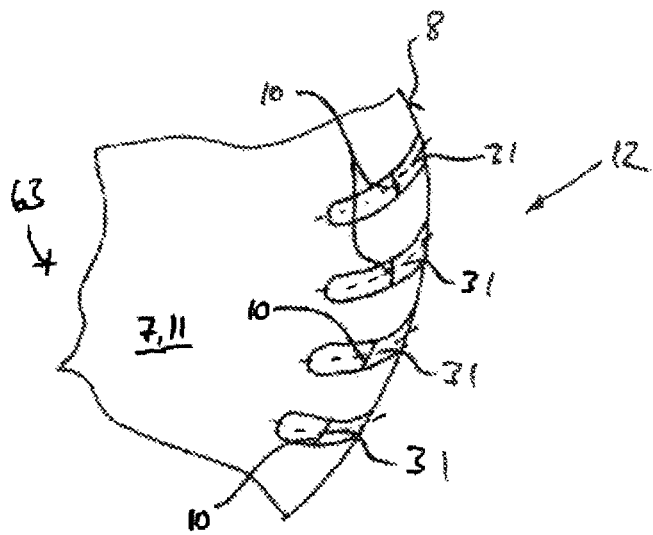
FIG. 34 shows a schematic bottom view of a further semiconductor device structure.

FIG. 34 shows a schematic bottom view of a further semiconductor device structure which is similar to the semiconductor device structure of FIGS. 29-32. Parts which are similar to parts of the aforementioned semiconductor device structure have the same reference numbers.

The slits 31 are bent in a plane of the wafer 12 and they are similar to the shape of turbine blades. One way of producing the bent slits would be to use a cylindrical or conical milling head which is moved into the rim 1 of the waver 12. The resulting slits 31 are provided such that they intersect with the central portion 2, cutting the bottom face 7 and the outer face 8. The top face 6 on the upper side of the wafer 12 is not cut. The slits 31 can also be provided at least partly by an etching process.

This provides reinforcement structures as elevated areas over the central portion 2, the reinforcement structures comprising parts of the rim 1.

The radial geometrical moment of inertia of the wafer 12 can be further improved and there may be a reduced local stress concentration in the slits 31 which then improves the fracture strength of the wafer 12. The bent slits 31 may also have positive effects for discharging liquids through the perforations 10 in the slits 31 when the wafer 31 is spinning.

Figure 35:
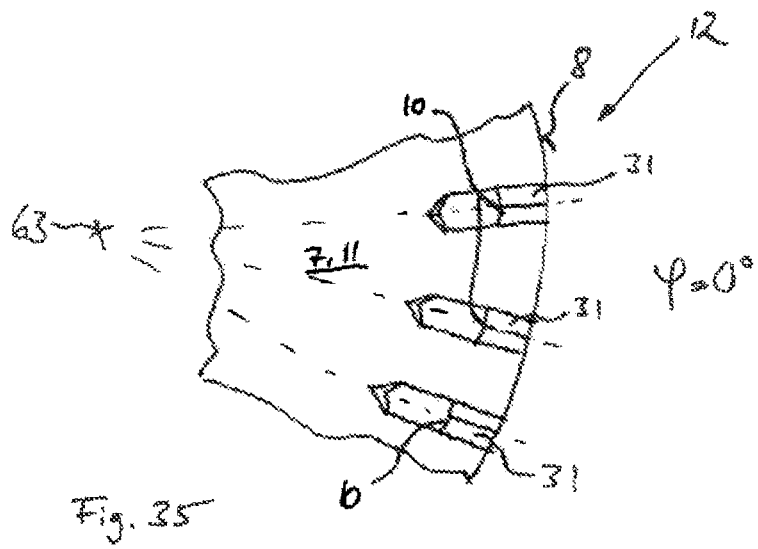
FIG. 35 shows a schematic bottom view of a further semiconductor device structure.

FIGS. 35 and 36 show a schematic bottom view and an outside view of a further semiconductor device structure which is similar to the semiconductor device structures of FIGS. 29-32 or of FIG. 34. Parts which are similar to parts of the aforementioned semiconductor device structure have the same reference numbers.

The slits 31 are made with a bevelled or sloped cutting blade which is moved into the rim 1 of the waver 12, starting at its bottom face 7 and outer face 8. The resulting slits 31 are provided such that they intersect with the central portion 2, cutting the bottom face 7 and the outer face 8. The top face 6 on the upper side of the wafer 12 is not cut. The slits 31 can also be provided at least partly by an etching process.

This provides reinforcement structures as elevated areas over the central portion 2, the reinforcement structures comprising parts of the rim 1.

The slits 31 which have bevelled grounds in the bottom face 7 and in the outer face 8 have, as compared with the design of FIG. 7, an increased cross-section area for a given cutting depth. This can have positive effects for discharging liquids through the perforations 10 in the slits 31.

In a further alternative not shown here, the slits 31 with bevelled grounds in the bottom surface 7 and in the rim 1 and outer face 8 are provided with an inclined orientation with respect to the radial direction of the wafer 12. This is design is insofar similar to the design of FIGS. 29-32.

FIG. 37 shows a schematic top view of a further semiconductor device structure. Parts which are similar to parts of the aforementioned semiconductor device structure have the same reference numbers. Different from the foregoing designs, the design of FIG. 37 has slits 31 which are provided in the rim 1 on the top face 6 of the waiver 12 such that the slits 31 extend through the upper part of the rim 1. There are reinforcement structures provided as elevated blocks between two neighbouring slits 31. FIG. 37 shows a design with a radial inclination angle φ which is here 0° (degrees), so that there is a full radial overlap of the inner orifice 31' at the perforation 10 and the respective outer orifice of the slits 31. There appears, no important advantage with respect to stability against bending in a radial direction of the wafer 12 as compared with a wafer without the reinforcement structures but this design may have advantages with respect to discharging fluids from a spinning wafer 12.

FIG. 38 shows a schematic top view of a further semiconductor device structure which is similar to the semiconductor device structure of FIG. 10 before cutting of the rim 1. Parts which are similar to parts of the aforementioned semiconductor device structure have the same reference numbers.

As can be best seen in FIG. 39 which shows a schematic cross sectional view of the semiconductor device structure of FIG. 38, a grinding stone with a grinding angle α (alpha) of about 45° has produced an upper edge 60 at a top face 6 and a lower edge 61 at a second side 4 with a sloping surface extending between the upper edge 60 and the lower edge 61. Other angles α (alpha) for the sloping surface between the upper edge 60 and the lower edge 61 are possible, especially between 10° and 60°. In a further embodiment which is not shown here, the upper edge 60 and the lower edge 61 can be rounded so that there is no literal edge line present. This can facilitate the flow of fluids over the top face 6. Good results can be obtained if the outline of the sloping surface follows the shape of a mathematical tangens hyperbolicus curve.

The wafer 12 of FIG. 38 can immediately be used for providing electronic circuits and semiconductor device structures on its front surface 11 and on its second side 4, for example as shown in the foregoing Figures, especially as shown with reference to FIGS. 1 to 28. Liquids which are used in these process steps can escape over the rim 1 by simply flowing over the sloping surface between the upper edge 60 and the lower edge 61.

Not shown here is a further embodiment which is a combination of the teachings of FIG. 37 and FIGS. 38 and 39. There are reinforcement structures as elevated areas over the central portion provided, the reinforcement structures comprising parts of the rim which are separated by slits. The reinforcement structures have an upper edge at a top face and a lower edge at a second side of the wafer with a sloping surface extending between the upper edge and the lower edge. Such a wafer can be used for providing electronic circuits and semiconductor device structures on its front surface and on its second side. Liquids which are used in these process steps can escape over the rim by flowing over the sloping surface or ramp between the upper edge and the lower edge and through the slits between the reinforcement structures.

Figure 40:
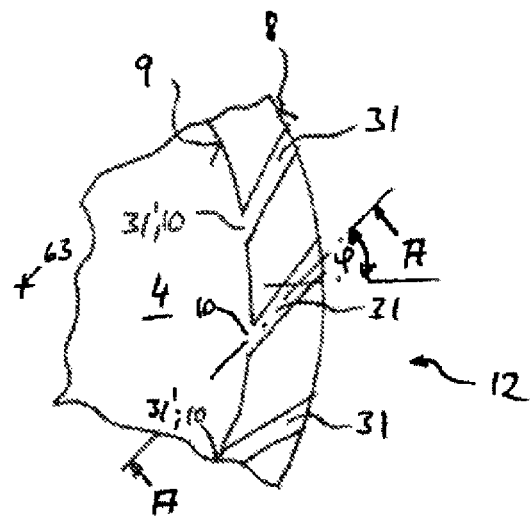
FIG. 40 shows a schematic top view of a further semiconductor device structure.

FIG. 40 shows a schematic top view of a further semiconductor device structure. Parts which are similar to parts of the aforementioned semiconductor device structure have the same reference numbers. Similar to the design of FIG. 37, the design of FIG. 40 has slits 31 which are provided in the rim 1 on the top face 6 of the wafer 12 such that the slits 31 extend through the upper part of the rim 1. Reinforcement structures are thereby provided as elevated blocks between two neighbouring slits 31. FIG. 40 shows a design with a radial inclination angle φ which is here about 60° (degrees), so that there is no radial overlap of the inner orifice 31' at the perforation 10 and the respective outer orifice of the slits 31.

This involves an increased stability against bending in a radial direction of the wafer 12 as compared with a wafer without the reinforcement structures and advantages with respect to discharging fluids from a spinning wafer 12.

The wafer 12 can be manufactured easily because most of the manufacturing steps and especially the mechanical steps thereof such as the grinding of the second side 4 and the provision of the slits 31 can be provided from one single side without intermediate handling of the wafer between the respective manufacturing steps. If a wet treatment takes place at the wafer 12, the wafer chuck is prevented from contamination with chemicals. Further, effective cross-section of the slits 31 can be increased which enhances a fluid flow through the slits 31.

Figure 42:
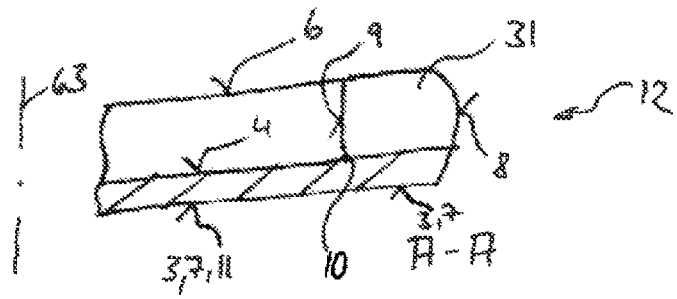
FIG. 42 shows a schematic view of the semiconductor device structures of FIGS. 37 and 40 along a cut line A-A, respectively.

FIG. 42 shows a cut section through a line A-A in FIG. 40, illustrating the passage from the outer face 8 to the inner face 9 of the wafer 12 which is provided through the slits 31.

Figure 41:
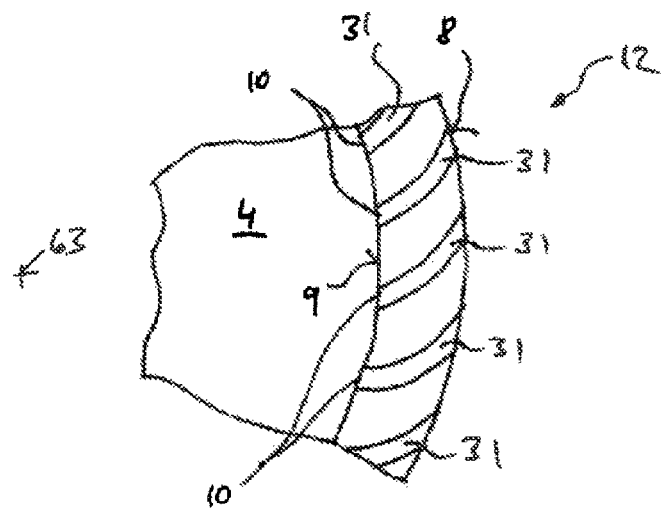
FIG. 41 shows a schematic top view of a further semiconductor device structure.

FIG. 41 shows a schematic top view of a further semiconductor device structure which is similar to semiconductor device structure of FIGS. 40 and 42. Parts which are similar to parts of the aforementioned semiconductor device structure have the same reference numbers.

The slits 31 are bent in a plane of the wafer 12 and they are similar to the shape of turbine blades. One way of producing the bent slits would be to use a cylindrical or conical milling head which is moved into the rim 1 of the waver 12. The resulting slits 31 are provided such that they intersect with the central portion 2, cutting the bottom face 7 and the outer face 8. The top face 6 on the upper side of the wafer 12 is not cut. The slits 31 can also be provided at least partly by an etching process.

This provides reinforcement structures as elevated areas over the central portion 2, the reinforcement structures comprising parts of the rim 1.

The radial geometrical moment of inertia of the wafer 12 can be further improved and there may be a reduced local stress concentration in the slits 31 which then improves the fracture strength of the wafer 12. The bent slits 31 may also have positive effects for discharging liquids through the perforations 10 in the slits 31 when the wafer 31 is spinning.

FIG. 43 shows a further semiconductor device structure. Parts which are similar to parts of the aforementioned semiconductor device structures have the same reference numbers.

The slits 31 of the semiconductor device structure of the FIGS. 29 to 32 are provided with a spatial orientation that provides a horizontal inclination angle σ (sigma) between each slit 31 and a horizontal direction of the wafer 12 at the location of the respective slit 31. It turned out that this can also provide an improvement of the stability of the wafer 12.

The spatial orientation of the slits 31 can also be combined with a radial inclination angle φ as in FIG. 32. A radial overlap of the inner orifice 31' and the respective outer orifice of the slits 31 can be avoided, leaving the second side 4 uncut and essentially with less or even without any damage or cracking.

FIG. 44 shows a further semiconductor device structure. Parts which are similar to parts of the aforementioned semiconductor device structures have the same reference numbers.

While the semiconductor device structure of FIG. 42 has slits 31 with a spatial orientation that provides a horizontal inclination angle σ (sigma) and with a radial inclination angle φ through the top face 6, leaving the bottom face 7 essentially uncut, the semiconductor device structure of FIG. 43 has slits 31 with a similar spatial orientation through the bottom face 7, leaving the top face 6 essentially uncut.

FIG. 45 shows a cross-section through a further semiconductor device structure, having a slit 31 with a spatial orientation that provides a horizontal inclination angle σ (sigma) and with a radial inclination angle φ (phi), the slit 31 extends through the top face 6 and through the bottom face 7. A virtual radial bending axis 62, an upper bending area Au, and a lower bending area Al are provided for the specific position on the circumference of the rim 1. These areas are useful for calculating and improving the local geometrical moment of inertia of the wafer against radial bending around the virtual radial bending axis 62 and ultimately for improving the stress levels in the wafer 12.

For producing the aforementioned semiconductor wafers with reinforcement structures, one can first create the passage in the form of slits 31 and then creating the recess in the rear surface 16 of the wafer 12. Alternatively, one can first create the recess in the rear surface 16 of the wafer 12 followed by creating the passages in the form of slits 31. With certain production methods and if the passage in the form of a ramp 60, 61 or slits 31 and the recess in the rear surface 16 are provided at the same side of the wafer 12—such as in FIGS. 37, 40, 41, 42, 43, and 45—the recess in the rear surface 16 of the wafer 12 and the passage in the form of a ramp 60, 61 or passages in the form of slits 31 can be created together and even in the same process period.

It is of advantage to provide the fluid passage in the form of slits 31 and the recess in the rear surface 16 at the same side of the wafer 12 because the reinforcement structures between the slits 31 do not form a continuous rim 1. These reinforcement structures are a collection of separate block segments which are discontinuously arranged at the circumference of the wafer 12. For such reinforcement structures, one can even use plasma etching without any mechanical grinding.

The passages in the form of slits 31 or in the form of a ramp 60, 61 can be provided by a dicing saw or in a more general sense with a circumferential grinding tool with a numerical control. Further ways to provide passages in the form of slits 31 or in the form of a ramp 60, 61 comprise using a laser abrasive method or a finger mill or an end mill, which is especially suited for providing bent slits as in FIG. 34 or 41. It is also possible to provide a lithographic structure followed by at least one etching step such as dry etching of silicon or wet etching or a combination of both etching methods.

If a grinding step is provided for the recess in the rear surface of the wafer 12, this is often followed by a plasma process for a relief of stress in the wafer material. This can also be done by a wet etching step. The wafer 12 of the application provides the advantage of an easy drain of the plasma gases or of the etching liquid from the recess in the rear surface of the wafer through the passages in the form of slits 31 or in the form of a ramp 60, 61. This has not been possible easily with the known wafers with a recess in their rear surface.

It is expected that there is increased mechanical stress in the silicon wafer, particular in the areas of the slits or in their vicinity, when the wafer is later subjected to bending.

Furthermore, due to the mechanical processing during backgrinding and dicing, the Silicon might be weakened due to subsurface damages, which further decrease the mechanical strength of the wafer material.

In the following, three methods and also their combinations are presented for decreasing the stress from bending and increase the mechanical strength of the wafer 12.

According to a first stress decreasing measurement, a rounded dicing wheel is used for creating the slits 31. According to fracture mechanics theory, this will decrease the stress in the notch of the slits 31.

According to a second stress decreasing measurement, which can be used as an alternative or in addition to the first stress decreasing measurement, the slits 31 can be etched, using a dry or a wet etching process, after dicing or after the final mechanical processing of the wafer 12. One objective is to use a predominantly isotropic etching process for removing just a few micrometers of the Silicon at the surfaces of the wafer 12. This outer Silicon has been subjected to mechanical processing from backgrinding or dicing the slits 31 and it has—due to microcracks and other surface properties—significantly less mechanical strength than the unprocessed Silicon before performing the manufacturing steps. Furthermore, isotropic etching processes automatically smoothen any edges and corners of the unprocessed wafer 12 and thus are decreasing the "notching effect".

According to a third stress decreasing measurement, which can be used as an alternative or in addition to one or both the first and second stress decreasing measurements, a special dicing technique enables to increase the geometric moment of inertia of the rim structures. By this dicing technique, bending stiffness is increased, and so stress is reduced when bending is done on the processed wafer 12.

These three measurements can be selectively combined or also used in conjunction with the idea "Inclined slits from the passive side" as shown in the Figures above, especially in FIGS. 37, 38, 40, 41, 42, and 43.

FIG. 47 shows a rounded dicing wheel 100 that creates a profile in the slits 31 that has significantly different mechanical properties with regards to the mechanical stress in the respective notch. If a notch is subjected to tensile stress that could arise from e.g. bending, the mechanical stress in the notch is proportional to $r^{(-0.5)}$ or $1/SQR(r)$, where r is the radius of the notch. This phenomenon is known in the theory of fracture mechanics as notching effect.

FIG. 46 shows a wafer 12 with a notch from a rectangular shaped dicing wheel 101 that will be subjected to much higher stress as compared with the wafer 12 with a smooth notch. By using a rounded dicing wheel 100. the stress level in the wafer 12 of FIG. 47 is reduced and thus its overall mechanical strength is increased.

A further technological advantage of using rounded dicing wheels is that the mechanical wear of these wheels is more uniform than for rectangular wheels. Rectangular dicing wheels are subjected to wear at the edges. Therefore, longer durability and tool life is expected for a rounded dicing wheel 100.

It is not so much relevant whether the wafer 12 is first thinned at the inner portion, followed by the dicing of the slits 31, or whether the first the dicing is done, followed by the thinning of the inner portion. The geometrical result at the end is the same.

FIGS. 48 and 49 illustrate a wet or dry etching for the reduction or removal of subsurface damages of the wafer 12. Brittle materials like Silicon show a completely different mechanical behavior as ductile materials as e.g. steel during mechanical processing like backgrinding or dicing. When Silicon is subjected to mechanical processing, the surface-near monocrystalline structure is destroyed and modified. The term "subsurface damages" is used here for describing these modifications. This area is characterized by microcracks, an increased dislocation density, and an increased share of polycrystalline or even amorphous crystal structure. Even if the depth of this subsurface damage is usually only some micrometer deep, depending on process and equipment technology, the occurrence of such microcracks has an negative effect on the macroscopic strength of the Silicon, as under tensile stress that can arise from bending, these microcracks can widen and lead ultimatively to the macroscopic crack of the Silicon wafer 12.

These subsurface damages are either reduced by a wet etching process, e.g. based on HF, or through a preferably isotropic etch process, e.g. based on SF6 or CF4. The material removal is usually only in the range of a few micrometers. This is considered as sufficient to remove the subsurface damages. Especially micro crack are removed due to their notching effect. The special feature of the above mentioned etch processes lies in the fact that they are purely based on chemical effects, therefore any further mechanical damage to the Silicon is avoided. After processing, the surface can be considered to be essentially free of subsurface damages and has better mechanical properties than before.

A side effect of isotropic etching is the fact that it also leads to a smoothing of edges and corners due to the etch attack from two or more sides.

It is worth noting that the isotropic etching by wet or dry processing can be applied for both of the following variations:
a) First dicing of the slits 31, then thinning of the inner portion
b) First thinning of the inner portion, then dicing of the slits 31

In an ideal process flow, the slits 31 are first diced into the wafer 12, followed by a thinning of the inner portion. Finally, the wafer 12 is subjected to a wet or dry etching. By this, the subsurface damage of the thinned inner portion is removed, and the subsurface damage of the slits 31 is removed at the same time.

It is also possible to do a wet or dry etching immediately after the dicing of the slits 31. The advantage is that an etching process can be tailor made for the geometry and requirements of the slits. A further etching step may be applied after the thinning of the inner portion.

FIG. 48 illustrates a wafer 12 with an overhead etching liquid dispenser 106. The etching liquid 107 is dispensed into the thinned part of the wafer 12. The wafer 12 is rotated around the vertical axis 105 so that the etching liquid 107 is driven out through the slits 31.

FIG. 49 illustrates the shape of the slits 31, 31' before etching with a dotted line and after etching with a full line. One can see the rounded shape of the slits 31, 31'

Figure 50:
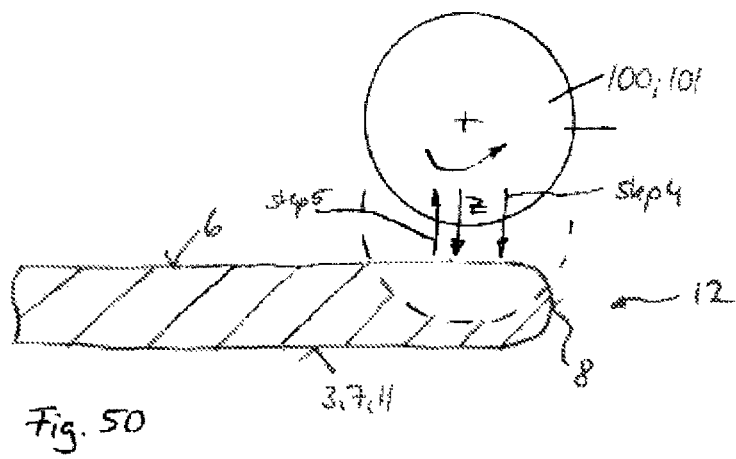
FIGS. 50 and 51 illustrate manufacturing of slits by means of moving a round or square dicing wheel along the vertical z axis.
Figure 51:
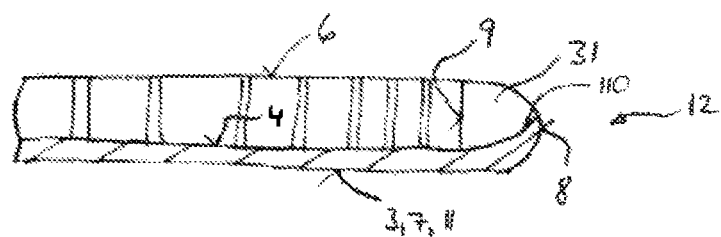

FIGS. 50 and 51 illustrate manufacturing of slits 31 by means of moving a round or square dicing wheel 100 or 101 along the vertical z axis.

This method comprises two steps. The first step is about using a standard dicing saw for creating inclined slits 31. This is a prerequisite to dicing of slits 31. The second step is about how the dicing can be improved for increasing the geometric moment of inertia if the rim.

One possible way for creating slits 31 comprises the use of the following components:
  a spindle with the dicing wheel 100 or 101, the spindle being moveable in x and y (horizontal) and z (lateral) directions,
  a dicing chuck for the wafer 12 is mounted, the dicing chuck being rotatable in the horizontal plane in alpha direction, e.g. as illustrated in FIG. 5

It should be noted that the spindle of the dicing wheel 100 can only be moved in cartesic directions when no rotation in alpha is possible. Thus, some adjustments are made to enable the dicing saw to generate inclined slits 31.

FIG. 56 illustrates the calculation of Y(offset)=f(radius R, inclination angle Phi)

Let Phi be the angle of inclination of the slits 31 relative to the radial axis. If R is the outer radius of the wafer 12, then the term Y(offset) describes the offset of the y-axis of the spindle, which is given as Y(offset)=R*sin(Phi). If the dicing wheel 100 produces its first cut at this position, it can be seen that the slits 31 are created with the angle Phi relative to the radial axis. If the wafer 12 now rotates by moving the chuck by increments of an angle delta Alpha, a multitude of slits 31 can be created along the outer circumference of the wafer 12.

FIGS. 50 and 51 illustrate the manufacture of slits 31 by moving the spindle along the vertical z-axis. An improved method of dicing the slits 31 is disclosed. The new method will improve the geometric moment of inertia against bending of the wafer 12.

One dicing method for the singulation of wafers into dies is as follows.

The dicing wheel 100 is positioned far outside the wafer area and is brought to the correct z-position which is defining the cutting depth. For a wafer with 700 μm (micrometer) thickness that is laminated onto a 100 μm thick dicing tape and that shall be diced with cutting 20 μm into the dicing tape, the z-thickness relative to chuck—which usually defines z=0—is 100 μm−20 μm=80 μm. The thickness of the wafer 12 is finally irrelevant.

Once the dicing wheel 100 has reached its target height, the z-position usually remains unchanged during dicing. The dicing wheel 100 moves in x- and y-direction, whereby the chuck is rotated by an angle of 90 degrees, so that the final result is a chess-board like pattern which separates the wafer 12 into dies.

A similar method can be used to create the slits 31. In the following, an example is given for a wafer with 700 μm thickness, where the thinned inner portion has a target thickness of 100 μm.

Step 1: The dicing wheel 100 moves to the position Y(offset) which has been described above as a function of the wafer radius R and the angle of inclination Phi. This setting of the dicing wheel 100 remains the same during the further procedure.

Step 2: The dicing wheel 100 moves to the vertical position z=100 μm. This is done at an x-position outside of the wafer 12 to avoid collision. This z-setting also remains unchanged during the further procedure.

Step 3: The dicing wheel 100 then moves into the wafer by using an x-axis displacement. The amount of movement is about 3 . . . 6 mm, depending on the target width of the stability increasing segments that will be created later on the wafer 12.

Step 4: The dicing wheel 100 then moves back to the position of step 2.

Step 5: The wafer chuck rotates together with the wafer 12 by a step of delta Alpha as shown in FIG. 56. If 100 slits 31 are to be created, the increment is 360/100=3.6 degrees per step.

The steps 4-6 are repeated one hundred times.

The result are slits 31 which are parallel in all points to the lower surface of the wafer.

In the following, a further dicing method is described that yields an increased geometric moment of inertia against bending of the wafer 12 by creating an elevated area 110.

Step 1: The dicing wheel 100 is in a z-position above the wafer 12, so that the dicing wheel 100 can move in x-direction and in y-direction without collision with the wafer 12.

Step 2: The dicing wheel 100 moves to the y-position y=y(offset). This setting remains unchanged during the further steps.

Step 3: The dicing wheel 100 moves along the x-direction such that the lower vertex of the dicing wheel 100 is located above the wafer 12, with a radial distance from the vertex to the edge of the wafer 12 being as large as the target width of the stability enhancing segments that are to be created.

Once this position is reached, the x-position remains unchanged during the further process.

Step 4: The dicing wheel 100 moves downward along the z-direction until the lower vertex of the dicing wheel 100 touches the target thickness of the inner portion of the wafer 12. At this time, the wafer 12 is not yet thinned, this thinning is done later.

Step 5: The dicing wheel 100 moves upwards along the z-direction until there is no contact between the dicing wheel 100 and the wafer 12.

Step 6: The mounting chuck with the wafer 12 rotates by 3.6 degree, if 100 slits 31 are to be created.

Step 7: Steps 4 to 7 are repeated 100 times.

Backside grinding of the wafer 12 can be done before or after cutting the slits 31.

FIGS. 50 and 51 illustrate a wafer 12 with a slit 31 with an elevated area 110 that is produced with the above dicing method applied before backside grinding.

The result is a slit 31 which has a different shape than the one that can be obtained by using the dicing method which moves the dicing wheel 100 along the x-axis. The slit 31*b* starts flush with the inner thinned portion of the wafer 12 and it ends at a slightly elevated level at the elevated area 110 at the edge 8 of the wafer 12. Such a elevation of the outer area of the slit 31—even it should be only marginal—results in a relatively large increase of the geometric moment of inertia against bending of the wafer 12. The geometric moment of inertia against bending of the wafer 12 is cubed with the height of the elevation at the outer area of the slit. An increase of the geometric moment of inertia leads automatically to an increase in bending stiffness and to a decrease in the maximum tensile stress, if a bending moment is applied to the wafer.

In the case that the lower vertex is exactly above the inner starting point of the stability enhancing segments and if the lower vertex exactly stops at a height that is identical to the target thickness of the inner thinned portion, the following relationships can be derived between the elevation of the slit H, the dicing wheel radius R, the inclination angle Phi, and the width of the stability segments B:

The effective length B' of the slit 31 between the to openings 31 and 31' is given by B'=B/cos(Phi), with B the width of the stability segments which is usually in the range of 2 . . . 5 mm, and Phi the inclination angle of the slits (in the range of 20 . . . 80 deg), see for example FIG. 40.

It is believed that effective slit length B' can be approximated by the elevation H of the slit 31 according to the following formula.

$$H=R*(1-\cos(alpha))$$

with R=radius of the dicing wheel, and alpha=arcsin(B'/R)

FIG. 57 illustrates calculating the elevation H of the slit 31 at the outer edge 8.

The increase H of the slit 31 at the outer edge 8 of the wafer 12 is therefore a function of the segment width B', the dicing wheel radius R and the inclination angle Phi. If the segment width B' is chosen to be 3 mm and the inclination angle Phi is 45 degrees, then the effective length of the slit 31 is calculated to be 4.24 mm.

With a dicing wheel radius of 40 mm, the elevation H is then 225 μm. If the target thickness of the inner thinned portion of the wafer is then e.g. 100 μm, the total Silicon thickness in the slit 31 at the outer edge 8 is then 325 um.

The average slope in the slit is then 225 um/4240 um*100%=5%. An effect on the fluid dynamic behavior of the fluids leaving the wafer through the slits is not expected, as this slope is rather low and there is no discontinuity in the slit.

Further variations can be obtained, if the dicing wheel 100 moves from the z-axis once or even several times into the wafer, whereas each cut can be done with different z or x positions, and different diameters of the dicing wheel. FIGS. 52, 53, 54, and 55 illustrate this.

We define the following positions and areas which are a function of the x-position:
position I is exactly above the inner start of the stability segments that are later created,
area V lies radially seen inside of Position I
position III is exactly above the outer edge of the wafer
Area IV is radially outside the wafer
Area III is between position I and position III Further, we define the following positions and areas which are a function of the z-position:
i) an area where the lower vertex of the wheel 100 is above the level of the thinned inner portion of the wafer 12
ii) a position in which the vertex is essentially at the level of the thinned inner portion,
iii) an area, where the lower vertex is lower than the level if the thinned inner portion.

All positions and areas which are a function of x and z can freely be combined. It is also possible to have several sequential cuts, whereas the cuts can have different x-areas, y-areas, and radius of the dicing wheel 100. This offers more opportunities to vary the geometry of the slit 31.

Figure 53:
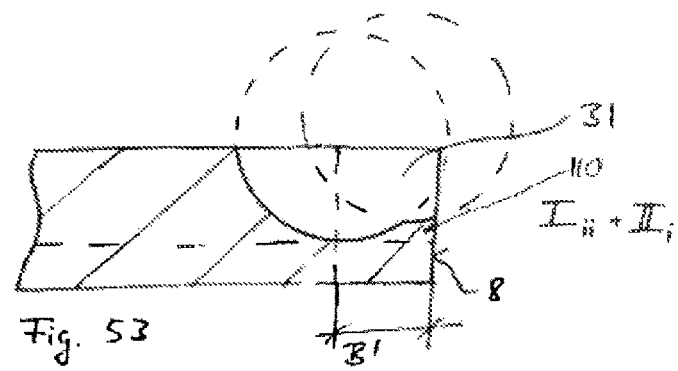

Some examples are given to illustrate this further:

FIG. 53 shows a first cut that is made at Position I-ii, and another cut is done at II-I. This results in a flattening of the slit 31 towards the outer edge 8.

Figure 54:
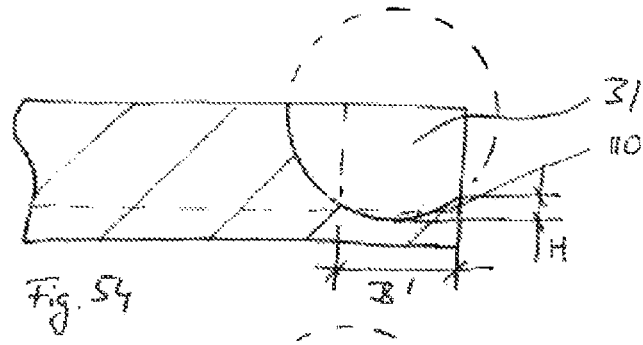

FIG. 54 shows only one cut that is made at position I-iii. This results in some kind of allowance for the backside grinding, ensuring that if there are any inaccuracies in the thinning process of the inner portion, that the slit 31 is always flush and aligned with the thinned inner portion, allowing the fluid to flow out of the wafer 12. Taking into account some thinning errors, any sharp step is avoided, which could have a negative effect on the fluid dynamic behavior. E.g. if the target thickness of the inner portion is 100 μm, the cutting depth z would be set at 90 μm.

Figure 55:
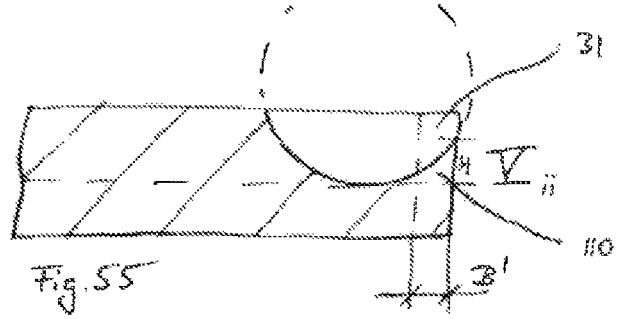

Another variant can be achieved if the cut is set at V-ii, as shown in FIG. 55. This will create a step in the slit 31, which can for example be used to slow down the movements of liquids in the slit 31.

It is important to note that all above mentioned methods for the creation of slits by dicing are independent of whether the slits are created prior to thinning, or whether first the dicing is done and then the thinning of the inner portion of the wafer 12. The geometric final result is the same, but there might be differences in the processes.

The above mentioned methods for the creation of slits with an elevation towards the outer edge can be partially or completely be substituted by other methods for processing Silicon, e.g. anisotropic dry or wet etching of Silicon, laser ablation, or any other combination thereof.

In further embodiments which are not shown here, the combination of the above methods "Use of rounded dicing wheel 100", "wet/dry etching after dicing" and creation of the slits by lowering the dicing wheel along the z-Axis can be combined.

Further, all other methods in this patent can be combined together.

A reliable result can be achieved by the following relatively simple process.

dicing from that side of the wafer 12 which is later subjected to grinding, the slits should be diced with an inclination angle Phi, using a dicing wheel 100 with a rounded shape, wherein dicing is performed with a movement of the dicing wheel along the z-axis for creating an elevated area 110 wet or dry etching after grinding and dicing.

The invention claimed is:

1. A method comprising:

providing a semiconductor wafer comprising a front surface and a rear surface;

producing integrated electronic circuits or semiconductor device structures at the front surface;

providing a slit on the front surface at an outer circumference side of an area of the integrated electronic circuits or semiconductor device structures; and providing a thinned central portion on the rear surface, the thinned central portion provided by a recessed portion of the rear surface, the recessed portion defined inward from an annular rim of the semiconductor wafer, the recessed portion communicating with the slit to form an opening; and depositing of a metal or carbon seed layer for a metallization structure or a bump plating structure onto a second side of said thinned central portion, said metal or carbon seed layer being structured and plated to said metallization structure and/or said bump plating structure, depositing of said metal or carbon seed layer comprising:

depositing the metal or carbon seed layer to the second side of the thinned central portion;

spraying-on and spinning of a resist layer and escaping of excess resist through said opening;

drying the resist layer;

structuring the dried layer by exposition through a mask;

developing the exposed resist layer by spraying-on developing liquid and escaping of excess resist and excess developing liquid through said opening;

rinsing the structured resist layer by spraying-on a rinsing liquid and escaping of excess rinsing liquid through said opening;

hardening a developed resist structure to a plating mask;

plating an uncoated resist free seed layer to a metallization structure and/or to metallic bumps in an electrochemical bath by circulating an electrochemical liquid over a structured seed layer and bypassing said liquid through said opening;

stripping off a resist of said plating mask from the second side by spraying-on a stripping liquid and escaping of excess stripping liquid and stripped resist through said opening;

cleaning the stripped structure by a cleaning liquid and escaping of excess cleaning liquid through said opening;

wet etching remaining parts of the seed layer by spraying-on of etch liquid and escaping of excess etch liquid through said opening;

rinsing the etched structure by spraying-on a rinsing liquid and escaping of excess rinsing liquid through said opening; and cleaning the second side with bumps by a cleaning liquid and escaping of excess cleaning liquid through said opening and drying the semiconductor wafer.

2. The method according to claim 1, wherein the slit is provided from the front surface to an intermediate portion of the semiconductor wafer, and wherein the intermediate portion is between the front surface and the rear surface.

3. The method according to claim 1, comprising the provision of holes for electrical connections between the front surface and the rear surface of the thinned central portion of the semiconductor wafer.

4. The method according to claim 3, comprising etching or laser ablating of the holes.

5. The method according to claim 1, comprising the provision of a recessed portion into the front surface of the semiconductor wafer for providing a double recessed thinned central portion having a first side and a second side.

6. The method according to claim 1, wherein providing said opening comprises cutting of slits by a dicing saw blade.

7. The method according to claim 6, wherein the cutting is done with a radial inclination.

* * * * *